United States Patent
Togura

(10) Patent No.: US 8,692,565 B2
(45) Date of Patent: Apr. 8, 2014

(54) CAPACITIVE PROXIMITY SENSOR AND PROXIMITY SENSING METHOD

(75) Inventor: Takeshi Togura, Sakura (JP)

(73) Assignee: Fujikura Ltd., Tokyo (JP)

( * ) Notice: Subject to any disclaimer, the term of this patent is extended or adjusted under 35 U.S.C. 154(b) by 684 days.

(21) Appl. No.: 12/677,907

(22) PCT Filed: Oct. 6, 2008

(86) PCT No.: PCT/JP2008/068194
§ 371 (c)(1),
(2), (4) Date: May 19, 2010

(87) PCT Pub. No.: WO2009/044920
PCT Pub. Date: Apr. 9, 2009

(65) Prior Publication Data
US 2010/0259283 A1    Oct. 14, 2010

(30) Foreign Application Priority Data

Oct. 4, 2007 (JP) ................... 2007-261233
Nov. 14, 2007 (JP) ................... 2007-295607

(51) Int. Cl.
*G01R 27/00* (2006.01)
*G01R 27/26* (2006.01)
*H03K 17/955* (2006.01)

(52) U.S. Cl.
USPC ............. 324/679; 324/600; 324/658

(58) Field of Classification Search
CPC ............. G01R 27/2605; H03K 17/955; H03K 2217/960725; G01D 5/2405
USPC ......................... 324/600, 658–690
See application file for complete search history.

(56) References Cited

U.S. PATENT DOCUMENTS

| | | | |
|---|---|---|---|
| 6,452,514 B1 * | 9/2002 | Philipp | 341/33 |
| 7,129,714 B2 * | 10/2006 | Baxter | 324/678 |
| 2003/0016849 A1 * | 1/2003 | Andrade | 382/124 |
| 2006/0076985 A1 * | 4/2006 | Martinez et al. | 327/110 |
| 2009/0040191 A1 * | 2/2009 | Tong et al. | 345/174 |

FOREIGN PATENT DOCUMENTS

| | | |
|---|---|---|
| JP | 2001-35327 A | 2/2001 |
| JP | 2005-227225 A | 8/2005 |
| JP | 2006-145488 A | 6/2006 |
| JP | 2007-18839 A | 1/2007 |

OTHER PUBLICATIONS

International Search Report of PCT/JP2008/068194, mailing date of Dec. 9, 2008.

* cited by examiner

*Primary Examiner* — Jermele M Hollington
*Assistant Examiner* — Farhana Hoque
(74) *Attorney, Agent, or Firm* — Westerman, Hattori, Daniels & Adrian, LLP

(57) ABSTRACT

A capacitive proximity sensor (100) comprises a sensor unit (10) and a sense circuit unit (20). The sensor unit (10) includes a sensor electrode (11), a shield electrode (12) and an auxiliary electrode (13). The sensor electrode (11) is connected to a C-V conversion circuit (21) and the shield electrode (12) is connected to a shield drive circuit (24). The auxiliary electrode (13) is connected via a change-over switch (30) to the C-V conversion circuit (21) or the shield drive circuit (24). The capacitance values (C1, C2) switched by the change-over switch (30) and detected at the C-V conversion circuit (21) are compared to arbitrarily set a range of a sense region on the sensor electrode (11).

24 Claims, 15 Drawing Sheets

CAPACITIVE PROXIMITY SENSOR AND PROXIMITY SENSING METHOD

TECHNICAL FIELD

The present invention relates to a capacitive proximity sensor and proximity sensing method for sensing proximity of a sense target such as a human body based on a variation in capacitance.

BACKGROUND ART

Proximity sensors for sensing proximity of a sense target such as a human body include the following type as known. The proximity sensor comprises a bottomed cylindrical fixed shield electrode, a disc-like detection substrate attached to the opening end of the fixed shield electrode, and a sensor electrode arranged at the central portion of the detection substrate to face a sense target.

The proximity sensor also comprises a movable shield electrode arranged outside the fixed shield electrode and slidable along the axial direction. Thus, it is configured with these members to adjust the sensible range and sensibility in accordance with various detection conditions and sense the sense target reliably (see, for example, Patent Document 1).

The proximity sensor may be given directivity in this way with arrangement of the shield electrode on the circumference or the rear of the sensor electrode to form a dead zone, thereby determining the range of the sense region within certain directions from the sensor electrode in general.

Patent Document 1: JP 2001-35327A

DISCLOSURE OF THE INVENTION

Problem to be Solved by the Invention

The proximity sensor structured as above may be used not to sense a sense target such as a human body present in the proximity of the sensor electrode but to sense a sense target located at a distance almost the same extent of the electrode size of the sensor electrode. In such the case, even the arrangement of the shield electrode on the circumference of the sensor electrode hardly reduces the capacitance between the sense target and the sensor electrode and has difficulty in improving the directivity as a problem.

To improve the directivity, a shield electrode shaped to cover the sensor electrode three-dimensionally is arranged as in the proximity sensor described in Patent Document 1. In this case, the sensor structure becomes three-dimensional and accordingly up-sizes the entire and reduces the arrangement flexibility as another problem.

The present invention has been made in consideration of such the problems and accordingly has an object to provide a capacitive proximity sensor and proximity sensing method, which uses no three-dimensional structure, thus prevents a reduction in the arrangement flexibility and improves the directivity, thereby setting an arbitrary range of a sense region and sensing a sense target reliably.

Means to Solve the Problem

To solve the above problems and achieve the object, the present invention provides a first capacitive proximity sensor, comprising: a sensor electrode; an auxiliary electrode arranged in the vicinity of the sensor electrode; a detection circuit connected at least to the sensor electrode and operative to detect a capacitance value based on a capacitance on the connected electrode; a change-over switch capable of selectively switching between a first connection state of not connecting the auxiliary electrode to the detection circuit and a second connection state of connecting the auxiliary electrode to the detection circuit; and a comparison/decision means operative to compare a first capacitance value from the detection circuit in the first connection state with a second capacitance value from the detection circuit in the second connection state to yield a comparison result, and decide whether or not a sense target locates within a range of a sense region based on the comparison result and the first or second connection state.

The present invention also provides a second capacitive proximity sensor, comprising: a sensor electrode; an auxiliary electrode arranged in the vicinity of the sensor electrode; a detection circuit operative to detect a capacitance value based on a capacitance on the sensor electrode; a shield drive circuit for applying to the auxiliary electrode an equivalent potential as that on the sensor electrode; a change-over switch capable of selectively switching between a first connection state of connecting the auxiliary electrode to the shield drive circuit and a second connection state of making the auxiliary electrode open, grounded, or connected to a certain fixed potential; and a comparison/decision means operative to compare a first capacitance value from the detection circuit in the first connection state with a second capacitance value from the detection circuit in the second connection state to yield a comparison result, and decide whether or not a sense target locates within a range of a sense region based on the comparison result and the first or second connection state.

The present invention provides a third capacitive proximity sensor, comprising: a sensor electrode; an auxiliary electrode arranged in the vicinity of the sensor electrode; a detection circuit operative to detect a capacitance value based on a capacitance on the connected electrode; a first change-over switch capable of selectively switching between a first connection state of connecting the sensor electrode to the detection circuit and a second connection state of not connecting the sensor electrode to the detection circuit; a second change-over switch changeable so as not to connect the auxiliary electrode to the detection circuit when the sensor electrode is in the first connection state and so as to connect the auxiliary electrode to the detection circuit when the first change-over switch is in the second connection state; and a comparison/decision means operative to compare a first capacitance value from the detection circuit in the first connection state with a second capacitance value from the detection circuit in the second connection state to yield a comparison result, and decide whether or not a sense target locates within a range of a sense region based on the comparison result and the first or second connection state.

The capacitive proximity sensor according to the present invention thus configured can improve the directivity and set an arbitrary range of a sense region. Accordingly, under various detection conditions, it is capable of sensing a sense target reliably. In addition, it uses no three-dimensional structure. Accordingly, it has higher sensor arrangement flexibility and thus is applicable at various places.

In the first capacitive proximity sensor, the change-over switch may be configured such that in the first connection state it is capable of making the auxiliary electrode open, grounded, or connected to a certain fixed potential.

The capacitive proximity sensor may further comprise a shield drive circuit for applying to the auxiliary electrode an equivalent potential as that on the sensor electrode, wherein the change-over switch may be configured such that in the first connection state it is capable of connecting the auxiliary electrode to the shield drive circuit.

In the third capacitive proximity sensor, the first change-over switch may be configured such that in the second connection state it is capable of making the sensor electrode open, grounded, or connected to a certain fixed potential, wherein the second change-over switch may be configured such that in the first connection state it is capable of making the auxiliary electrode open, grounded, or connected to a certain fixed potential.

The capacitive proximity sensor may further comprise a shield drive circuit for applying to the auxiliary electrode an equivalent potential as that on the sensor electrode or applying to the sensor electrode an equivalent potential as that on the auxiliary electrode, wherein the first change-over switch may be configured such that in the second connection state it is capable of connecting the sensor electrode to the shield drive circuit, wherein the second change-over switch may be configured such that in the first connection state it is capable of connecting the auxiliary electrode to the shield drive circuit.

The capacitive proximity sensor may further comprise a shield drive circuit for applying to the auxiliary electrode an equivalent potential as that on the sensor electrode, wherein the first change-over switch may be configured such that in the second connection state it is capable of making the auxiliary electrode open, grounded, or connected to a certain fixed potential, wherein the second change-over switch may be configured such that in the first connection state it is capable of connecting the auxiliary electrode to the shield drive circuit.

The capacitive proximity sensor may further comprise a shield drive circuit for applying to the sensor electrode an equivalent potential as that on the auxiliary electrode, wherein the first change-over switch may be configured such that in the second connection state it is capable of connecting the auxiliary electrode to the shield drive circuit, wherein the second change-over switch may be configured such that in the first connection state it is capable of making the auxiliary electrode open, grounded, or connected to a certain fixed potential.

The capacitive proximity sensor may further comprise a shield electrode which is arranged on the rear surface of the sensor electrode, the rear surface of the sensor electrode being a surface opposing a sense surface of the sensor electrode, and which is insulated from the sensor electrode to shield the sensor electrode from sensing on the rear surface.

The shield electrode may be connected to a shield drive circuit for applying an equivalent potential as that on at least either of the sensor electrode and the auxiliary electrode to the shield electrode.

The auxiliary electrode may be arranged on the same plane as the sense surface of the sensor electrode and insulated from the sensor electrode.

The auxiliary electrode may be arranged around the sensor electrode.

The auxiliary electrode may be arranged concentric with the sensor electrode.

The comparison/decision means may be configured such that it divides the first capacitance value by the second capacitance value and multiplies the quotient by a certain coefficient to yield a comparison value, and identify whether or not the comparison value is equal to or higher than a predetermined threshold to decide whether or not a sense target locates within the range of the sense region.

The capacitive proximity sensor may further comprise a dummy electrode having a sense surface covered with a shield electrode, wherein the detection circuit may be configured operable differentially, wherein one input terminal of the detection circuit is connected to the sensor electrode directly or via the first change-over switch, and the other input terminal of the detection circuit is connected to the dummy electrode.

The dummy electrode may be formed such that the area of the electrode surface is half the area of the sense surface of the sensor electrode or below.

The detection circuit may be configured such that it further detects a first initial capacitance or an initial capacitance of the first capacitance value with no sense target locating within the range of the sense region, and a second initial capacitance or an initial capacitance of the second capacitance value with no sense target locating within the range of the sense region, wherein the comparison/decision means may be configured such that it compares a first detection value obtained by subtracting the first initial capacitance from the first capacitance value with a second detection value obtained by subtracting the second initial capacitance from the second capacitance value to yield a comparison result, and decides whether or not a sense target exists within the range of the sense region based on the comparison result and the first or second detection value.

The capacitive proximity sensor may further comprise a reference voltage adjustment means for setting the output from the detection circuit at a reference voltage, wherein the detection circuit may be configured to acquire a first setting for adjusting to the reference voltage the first initial capacitance or an initial capacitance of the first capacitance value with no sense target locating within the range of the sense region, and a second setting for adjusting to the reference voltage the second initial capacitance or an initial capacitance of the second capacitance value with no sense target locating within the range of the sense region, and provide a first capacitance value adjusted with the first setting and a second capacitance value adjusted with the second setting, wherein the comparison/decision means may be configured such that it uses as the first detection value the quotient obtained by subtracting the reference voltage from the first capacitance value adjusted with the first setting, and as the second detection value the quotient obtained by subtracting the reference voltage from the second capacitance value adjusted with the second setting, then compares both to yield a comparison result, and decides whether or not a sense target exists within the range of the sense region based on the comparison result and the first or second detection value.

The comparison/decision means may be configured such that it provides a signal in accordance with the distance from the sense target to the sensor when it decides that a sense target locates within the range of the sense region based on either value of the first capacitance value, the second capacitance value, the first detection value and the second detection value, wherein the comparison/decision means sets the output at a certain fixed voltage when it decides that no sense target locates within the range of the sense region.

The certain fixed voltage may be the ground voltage or the reference voltage.

The comparison/decision means may be configured such that it provides a signal in accordance with the distance from the sense target to the sensor electrode when it decides that a sense target locates within the range of the sense region based on either value of the first capacitance value, the second capacitance value, the first detection value and the second detection value, wherein the comparison/decision means sets the output at high impedance when it decides that no sense target locates within the range of the sense region.

The present invention provides a proximity sensing method in a capacitive proximity sensor, the sensor comprising a sensor electrode, an auxiliary electrode arranged in the vicinity of the sensor electrode, a detection circuit operative to detect a capacitance value based on a capacitance detected with at least either of the sensor electrode and the auxiliary electrode, and a change-over switch for switching between the connection states of the electrodes with the detection circuit, thereby deciding whether or not a sense target locates within a range of a sense region, the method comprising: switching between the connection states of the sensor and auxiliary electrodes with the detection circuit by the change-over switch to vary the equicapacitance lines (planes) on the sense surface; detecting capacitance values before and after varying the equicapacitance lines (planes) to acquire them as a first and a second capacitance value; and deciding whether or not a sense target locates within the range of the sense region based on a comparison value between the first and second capacitance values and the first or second capacitance value.

The proximity sensing method may further comprise deciding the distance from the sense target to the sensor electrode based on the first or second capacitance value when the sense target locates within the range of the sense region.

Effect of the Invention

Thus, the present invention makes it possible to provide a capacitive proximity sensor and proximity sensing method, which uses no three-dimensional structure, thus prevents a reduction in the arrangement flexibility and improves the directivity, thereby setting an arbitrary range of a sense region and sensing a sense target reliably.

THE BEST MODE FOR CARRYING OUT THE INVENTION

The preferred embodiments associated with the capacitive proximity sensor and proximity sensing method according to the present invention will now be described in detail with reference to the drawings.

FIG. 1 is a brief diagram showing an example of the entire configuration of a capacitive proximity sensor according to a first embodiment of the present invention.

FIG. 2 is an illustrative view for illustrating the operational concept on sensing in the same capacitive proximity sensor.

FIGS. 3A and 3B provide illustrative view for illustrating relations between a sense target and lines of electrical force on sensing in the same capacitive proximity sensor.

FIG. 4 is an illustrative view for illustrating the operational concept on sensing in the same capacitive proximity sensor.

FIG. 5 is a flowchart showing an example of the proximity sense process in the same capacitive proximity sensor.

FIG. 6 is a block diagram showing a configuration example of a C-V conversion circuit in the same capacitive proximity sensor.

FIG. 7 is an operational waveform diagram showing an example of operational waveforms in the C-V conversion circuit in the same capacitive proximity sensor.

As shown in FIG. 1, a capacitive proximity sensor 100 comprises a sensor unit 10 arranged at a location for sensing a sense target such as a human body, and a sense circuit unit 20 arranged integrally with the sensor unit 10 via a substrate, not shown, or separately therefrom.

The sensor unit 10 includes a sensor electrode 11 formed in a rectangular flat plate, a shield electrode 12 formed on the rear surface of the sensor electrode 11 with a larger area than the sensor electrode 11, and an auxiliary electrode 13 formed coplanar with the sensor electrode 11 and in the shape of a rectangular ring surrounding the sensor electrode 11.

The sensor electrode 11 senses a sense target that locates (exists) within a sense region on the sense surface. The shield electrode 12 shields the rear surface of the sensor electrode 11 from sensing the sense target. The auxiliary electrode 13 varies equicapacitance lines (planes) on the sense surface of the sensor electrode 11. The shield electrode 12 may also be provided on the outer circumference of the auxiliary electrode 13 together with the above-described form.

The sense circuit unit 20 includes a C-V conversion circuit 21 serially connected to the sensor electrode 11, an A/D converter 22, a CPU 23, and a shield drive circuit 24. A change-over switch 30 is provided to switch between the connections of the input from the auxiliary electrode 13 with the C-V conversion circuit 21 and the shield drive circuit 24.

The C-V conversion circuit 21 converts a capacitance detected at the sensor electrode 11 or at the sensor electrode 11 and the auxiliary electrode 13 into a voltage. The A/D converter 22 converts an analog signal indicative of the voltage from the C-V conversion circuit 21 into a digital signal.

The CPU 23 exerts control over the entire of the capacitive proximity sensor 100 and additionally controls operation of the change-over switch 30 and decides the detection of a sense target (the presence/absence of a sense target) within the sense region. The shield drive circuit 24 drives the shield electrode 12 and the auxiliary electrode 13 at equipotential as the sensor electrode 11.

These sensor unit 10 and sense circuit unit 20 are formed, for example, on a substrate, not shown. Available examples of the substrate include a flexible printed substrate, a rigid substrate, and a rigid-flexible substrate. The sensor electrode 11, the shield electrode 12 and the auxiliary electrode 13 may include metal parts (conductive members) and electric wires of copper, copper alloy, aluminum or iron patterned on a substrate composed of an insulator such as polyethylene terephthalate (PET), polyethylene naphthalate (PEN), polyimide (PI), polyamide (PA), glass epoxy resin or ceramics.

The following description is given to operation of the capacitive proximity sensor 100 thus configured. First, under the control of the CPU 23, the change-over switch 30 is connected to the shield drive circuit 24. Operation in this case is described as operation 1. In the case of operation 1, the connection states of the sensor electrode 11, the shield electrode 12 and the auxiliary electrode 13 with the sense circuit unit 20 in the capacitive proximity sensor 100 are as shown in FIG. 2.

Namely, only the sensor electrode 11 is connected to the C-V conversion circuit 21 while the shield electrode 12 and the auxiliary electrode 13 are connected to the shield drive circuit 24. Accordingly, the capacitance between only the sensor electrode 11 and the sense targets A, B can be detected at the C-V conversion circuit 21.

At this time, the rear surface of the sensor electrode 11 is covered with the shield electrode 12 connected to the shield drive circuit 24. Therefore, the rear surface of the sensor electrode 11 has sensitivity almost equal to zero.

Both the sense targets A, B exist almost at equidistance from the sensor electrode 11. In this case, the influence by the auxiliary electrode 13 connected to the shield drive circuit 24 causes an equicapacitance line (plane) M as in the state shown in FIG. 2 and makes the sensitivity to the sense target B lower than the sensitivity to the sense target A. In a word, as shown in FIG. 3A, lines of electric force P directing from the sensor electrode 11 toward the sense target A present in the vicinity of the center of the sensor electrode 11 are less susceptible to lines of electric force P' (shield) directing from the auxiliary electrode 13. In contrast, as shown in FIG. 3B, lines of electric force P directing from the sensor electrode 11 toward the sense target B present outside the sensor electrode 11 are susceptible to lines of electric force P' (shield) directing from the auxiliary electrode 13.

Therefore, in the case of operation 1, both the sense targets A, B exist at equidistance from the sensor electrode 11 though the capacitance value detected at the C-V conversion circuit 21 is larger on the sense target A than the sense target B.

A first capacitance value C1 detected in such the operation 1 is stored in the CPU 23.

In the case of operation 1, the connection of the auxiliary electrode 13 to the shield drive circuit 24 lowers the sensitivity at the electrode end of the sensor electrode 11 than the sensitivity at the center of the sensor electrode 11 to cause a slight directivity.

In the case of operation 1, however, the sensitivity at the electrode end of the sensor electrode 11 lowers only slightly. Accordingly, the capacitance value on a sense target C present in a position closer to the sensor electrode 11 than the sense target A shown in FIG. 3B becomes almost equal to the capacitance value on than the sense target A and causes lines of electric force P in the state as shown in FIG. 2. Therefore, it is not possible to identify the difference between the sense targets A, C. This state can be said as one that can not achieve a stronger directivity.

Next, under the control of the CPU 23, the change-over switch 30 is connected to the C-V conversion circuit 21. Operation in this case is described as operation 2. In the case of operation 2, the connection states of the sensor electrode 11, the shield electrode 12 and the auxiliary electrode 13 with the sense circuit unit 20 in the capacitive proximity sensor 100 are as shown in FIG. 4.

Namely, the sensor electrode 11 and the auxiliary electrode 13 are connected to the C-V conversion circuit 21. Accordingly, the capacitance between both the electrodes 11, 13 and the sense targets A, B can be detected at the C-V conversion circuit 21.

At this time, the rear surface of the sensor electrode 11 is covered with the shield electrode 12 connected to the shield drive circuit 24. Therefore, the rear surface of the sensor electrode 11 has sensitivity almost equal to zero. An equicapacitance line (plane) M on the front surface (sense surface) of the sensor electrode 11 is in the state shown in FIG. 4, which has no directivity within a range of 180° on the sense surface.

Therefore, in the case of operation 2, both the sense targets A, B present at equidistance from the sensor electrode 11 are detected to have almost an equivalent capacitance value.

A second capacitance value C2 detected in such the operation 2 is stored in the CPU 23.

Thus, through operations 1 and 2 described above, the equicapacitance line (plane) M on the sense surface of the sensor electrode 11 can be varied to acquire the first capacitance value C1 detected in the presence of a slight directivity on the sense surface of the sensor electrode and the second capacitance value C2 detected in the absence of directivity on the sense surface of the sensor electrode.

The capacitive proximity sensor 100 in the first embodiment further operates as follows. First, the first capacitance value C1 and the second capacitance value C2 stored in the CPU 23 are compared. For example, in the case of operation 2 described above, the capacitance values detected from both the sense targets A, B have almost an equivalent value. Therefore, the sense targets A, B are almost at an equal distance from the sensor electrode 11 as can be identified. Next, in the case of operation 1, the capacitance value is smaller on the sense target B than the sense target A. Therefore, the sense target B exists outward more than the sense target A from the sensor electrode 11 as can be identified.

Therefore, the CPU 23 compares the second capacitance value C2 with the first capacitance value C1 to decide how far a sense target exists outward from the center of the sensor electrode 11 (that is, whether or not a sense target locates within a certain range (hereinafter also abbreviated as "within a range of a sense region") containing the region at least opposite to the sense surface of the sensor electrode 11).

The proximity sensing method with improved directivity according to the present invention includes the following operation. Namely, as shown in FIG. 5, the connection state of the auxiliary electrode 13 is switched to vary the equicapacitance lines (planes) on the sense surface of the sensor electrode 11 to detect the first capacitance value C1 and the second capacitance value C2 (step S101), which are then compared to derive a comparison value (step S102). Based on the first capacitance value C1 or the second capacitance value C2, the control decides whether or not a sense target approaches (step S103). The control also decides whether or not the comparison value between the first capacitance value C1 and the second capacitance value C2 is equal to or higher than a predetermined threshold (alternatively equal to or lower than the threshold, or lower than the threshold) (step S106).

If it is decided that the sense target approaches (Y at step S103) and that the comparison value between the first capacitance value C1 and the second capacitance value C2 is equal to or higher than the threshold (Y at step S106), then the control decides that the sense target is sensed (step S107).

On the other hand, if it is decided that no sense target approaches (N at step S103) or that the comparison value between the first capacitance value C1 and the second capacitance value C2 is not equal to or higher than the threshold (N at step S106), then the control decides that any sense target is not sensed (step S104).

After the decision of the sense target sensed or not-sensed (after step S104 or S107), the control decides whether or not to terminate the process (step S105). If it is decided to terminate the process (Y at step S105), the control terminates a series of the proximity sense processes in accordance with the present flowchart. If it is decided not to terminate the process (N at step S105), the control jumps to the above step S101 and repeats the subsequent processes.

Specifically, the control is set such that it can decides that a sense target approaches the sensor electrode 11 if, for example, the first capacitance value C1 is larger than an arbitrary threshold Th1 (step S103). The control is also set such that it can decides that a sense target locates outside the range of the sense region if a comparison value $\alpha$ and a comparison value $\beta$ computed through computational equations of the comparison value $\alpha=(a \times C1)-(b \times C2)$ and the comparison value $\beta=d \times C1/C2$ are smaller than an arbitrary threshold Th2 predetermined (step S106).

Thus, even though a sense target approaches (Y at step S103), if the control jumps to the step S106 and finds that the comparison value is smaller than the arbitrary threshold Th2 (N at step S106), the control recognizes that the sense target locates outside the range of the sense region and decides that the sense target is not sensed (step S104). If a sense target approaches (Y at step S106) and only the comparison value is equal to or larger than the arbitrary threshold Th2 (Y at step S106), the control decides that the sense target is sensed (step S107).

If it is decided in the step S107 that the sense target is sensed, the CPU 23 may provide a detection signal or provide a signal indicative of a proximity distance from the sense target to the sensor electrode 11 based on the first capacitance value C1 (a signal in accordance with the distance to the sensor electrode 11).

The above-described comparison values α, β and the values of coefficients a, b, d and thresholds Th1, Th2 as well as the computational equations of the comparison values α, β may vary depending on factors such as sensor shapes of the capacitive proximity sensor 100, installation environments and sense targets. Accordingly, the values and equations may be set one by one, while taking a profile, after these factors are determined.

Furthermore, in the above-described example the proximity of the sense target is decided through a comparison using the value obtained by dividing the first capacitance value by the second capacitance value. The proximity of a sense target may also be decided through a comparison using, for example, a value obtained by dividing the first capacitance value by a sum of the first capacitance value and the second capacitance value.

Thus, the capacitive proximity sensor 100 can achieve high-strength directivity when the threshold Th2 is larger and low-strength directivity when it is smaller, for example. Accordingly, it is possible to adjust the directivity arbitrarily, thereby setting the range of the sense region arbitrarily to sense a sense target reliably.

The C-V conversion circuit 21 varies the duty ratio in accordance with the capacitance C and comprises, as shown in FIG. 6, a trigger signal generation circuit 101 operative to generate a trigger signal TG at a certain period, a timer circuit 102 operative to generate a pulse signal Po of which duty ratio varies in accordance with the magnitude of the capacitance C connected to the input terminal, and a low pass filter (LPF) 103 operative to smooth the pulse signal Po.

The timer circuit 102 includes two comparators 201, 202, a RS flip-flop circuit (hereinafter referred to as "RS-FF") 203 having a reset terminal R and a set terminal S supplied with the outputs from these two comparators 201, 202, a buffer 204 operative to pass the output DIS from the RS-FF 203 to the LPF 103, and a transistor 205 on/off-controlled with the output DIS from the RS-FF 203.

The comparator 202 compares the trigger signal TG output from the trigger signal generation circuit 101 as shown in FIG. 7 with a certain threshold Vth2 divided by resistances R1, R2, R3 to provide a set pulse in sync with the trigger signal TG. The set pulse is used to set the Q output of RS-FF 203.

The Q output serves as the discharge signal DIS to turn off the transistor 205 and charges between the electrodes 11, 13 and the ground at a rate determined by a time constant produced from the capacitance C on the electrodes 11, 13 to the earth and a resistance R4 connected between the input terminal and the supply line, thereby elevating the potential of the input signal Vin at a rate determined by the capacitance C.

When the input signal Vin exceeds a threshold Vth1 determined by the resistances R1, R2, R3, the comparator 201 inverts the output thereof to invert the output from the RS-FF 203. As a result, the transistor 205 turns on and discharges the charge stored on the sensor electrode 11, for example, through the transistor 205.

Therefore, the timer circuit 102 provides the pulse signal Po that oscillates at a duty ratio based on the capacitance C on the sensor electrode 11 or between the sensor electrode 11 and the auxiliary electrode 13 as shown in FIG. 7. The LPF 103 smoothes this output to provide a DC detection signal Vout as shown in FIG. 7.

The detection signal Vout thus output from the C-V conversion circuit 21 is converted into a digital signal at the A/D converter 22 as described above. In FIG. 7, the waveforms drawn with the solid lines and the waveforms drawn with the dotted lines indicate that the former is smaller in capacitance than the latter and that the latter is in the object-approaching state, for example.

In the above-described capacitive proximity sensor 100, the sense circuit unit 20 is described to have such a configuration that the C-V conversion circuit 21 utilizes a well-known timer IC operative to vary the duty ratio of the output pulse with a resistor and a condenser, though the configuration is not limited to this one.

Namely, there are systems, for example: a system that applies a sine wave to measure an impedance directly from the variation in voltage due to the capacitance value or the value of current; a system that comprises an oscillation circuit containing the measurement-aimed capacitance to measure an oscillation frequency; a system that comprises a RC charge/discharge circuit to measure the charge/discharge time; a system that shifts the charge charged at a known voltage to a known capacity and measures the voltage thereon; and a system that charges an unknown capacity at a known voltage and shifts the charge to a known capacity several times, and then measures the times until the known capacity is charged up to a certain voltage. In additional processes, a threshold may be provided for the detected capacitance value, or the waveform of the capacitance may be analyzed to trigger when it becomes the relevant capacitance waveform.

It is premised that the C-V conversion circuit 21 in the sense circuit unit 20 converts the capacitance into a voltage. Though, the capacitance may be converted into data easily treated electrically or as software, for example, into a pulse width or directly into a digital value.

In the above-described capacitive proximity sensor 100, the sensor electrode 11, the shield electrode 12 and the auxiliary electrode 13 are arranged such that the first capacitance value C1 only on the sensor electrode 11 is compared with the second capacitance value C2 on the sensor electrode 11 and the auxiliary electrode 13 to decide the detection of a sense target. This is an example for description and the configuration may also be as follows.

FIG. 8 is an illustrative view for illustrating an example of the capacitive proximity sensor 100 having another configuration according to the first embodiment. In this example the capacitive proximity sensor 100 comprises a dummy sensor electrode (dummy electrode) 11' in addition to the sensor electrode 11, and the C-V conversion circuit 21 in the sense circuit unit 20 is configured to operate differentially.

Specifically, the plus input terminal is connected to the sensor electrode 11 and the minus input terminal to the dummy electrode 11' as shown in FIG. 8, for example, to subtract the value of a capacitance Cb from the value of a capacitance Ca, and the output value is compared with a threshold at a comparator to detect a sense target 49.

Such the C-V conversion circuit 21 may operate as follows. For example, a switch S1 is kept open (OFF), a switch S2 is grounded (GND) and a switch S3 is closed (ON) initially. From this state, when the switch S3 is made open (OFF), the switch S2 is changed to Vr and the switch S1 is connected to the inverting input of an opamp, the capacitances Ca and Cf can be charged up to CaVr and the capacitances Cb and Cf to CbVr.

Next, the switch S1 is made open (OFF) and the switch S2 is grounded (GND), and then the switch S1 is grounded (GND) to measure an output voltage V. The voltage at this time is represented by $V/Vr=\{(Cf+Ca)/Cf\}-\{(Cf+Cb)/Cf\}$ and a voltage in accordance with a proportion of the capacitance Ca to the capacitance Cb.

The C-V conversion circuit 21 thus configured to differentially operate (differential circuit) can cancel the temperature characteristic of the circuit and reduce the common mode noise. In this case, the minus input of the differential circuit is connected, for example, to the dummy electrode 11'. If the dummy electrode 11' makes capacitive coupling with a sense target, the sensitivity of the sensor itself lowers. Accordingly, the dummy electrode 11' is formed to have a sufficiently smaller area than the sensor electrode 11, or another shield electrode 48 at equipotential is provided between the dummy electrode 11' and the sense target 49 to reduce the capacitive coupling with the sense target 49, as required.

If the C-V conversion circuit 21 varies the duty ratio in accordance with the capacitance C, the output waveform from the sensor electrode 11 varies in accordance with the measurement-aimed capacitance. Accordingly, the shield drive circuit 24 described above may comprise a 1-fold amplification circuit including an opamp voltage follower or an FET source follower, to which the voltage on the sensor electrode 11 is supplied and the output therefrom is connected to the shield electrode 12 and so forth.

If the C-V conversion circuit 21 operates differentially, the output waveform from the sensor electrode 11 becomes a square wave having a voltage of Vr-GND and a frequency equal to the switching frequency of the switch and accordingly does not fluctuate in accordance with the capacitance value. Therefore, the shield drive circuit 24 may be configured to connect the non-inverting input of the opamp shown in FIG. 7 to the shield electrode 12 and so forth. If a drive current is required, an opamp of the high output current type may be interposed, or a Vr-GND square wave may be generated separately.

Further in the above-described first embodiment, the sensor electrode 11 is connected to the C-V conversion circuit 21, the shield electrode 12 is connected to the shield drive circuit 24, and the auxiliary electrode 13 is connected via the change-over switch 30 to the shield drive circuit 24 or the C-V conversion circuit 21, as configured. If the C-V conversion circuit 21 operates differentially, for example, the sensor electrode 11 is connected to the minus input terminal shown in FIG. 8, the shield electrode 12 is connected to the shield drive circuit 24, and the auxiliary electrode 13 is connected to the plus input terminal, as may be configured.

In this case, on operation 2 described above, the auxiliary electrode 13 is connected to the sensor electrode 11 to form almost no directivity. In contrast, on operation 1 described above, the value of the extent of capacitive coupling between the auxiliary electrode 13 and a sense target is subtracted from the capacitance value on the sensor electrode 11 to form loose directivity consequently. Similar to the above-described case, the detection values on operation 1 and operation 2 can be compared to exert the similar effect.

Furthermore, in the first embodiment described above, the change-over switch 30 is configured to connect the auxiliary electrode 13 to the shield drive circuit on operation 1 and to the C-V conversion circuit 21 on operation 2 to vary the equicapacitance lines (planes) between operation 1 and operation 2. Though, the change-over switch may also be configured to connect the auxiliary electrode 13 to the shield drive circuit on operation 1 and make it open, grounded or connected to a certain fixed potential on operation 2. Alternatively, the change-over switch may be configured to make the auxiliary electrode open, grounded or connected to a certain fixed potential on operation 1 and connect it to the C-V conversion circuit 21 on operation 2 to exert the similar effect. Thus, the auxiliary electrode 13 may be made open, grounded or connected to a certain fixed potential (such as a potential equivalent to the ground) via the change-over switch 30.

The change-over switch 30 may be structured to switch between connections electrically and may include an electronic circuit switch such as an FET and a photo-MOS relay, and a mechanical switch such as a contact switcher. Available examples of the shape of the sensor electrode 11 include a circular, a rectangular and a polygonal shape. If the rear surface of the sensor electrode 11 is used as the range of the sense region, the shield electrode 12 may not be disposed thereon. The auxiliary electrode 13 is arranged in the state of surrounding the entire circumference. Though, it may be arranged in the state of surrounding part, or arranged in an adjacent part. For example, if it is in the state of surrounding the sensor electrode 11, it may be arranged concentric with the sensor electrode 11 (at the same center).

A capacitive proximity sensor according to a second embodiment of the present invention is described next with reference to FIGS. 9-11.

In the capacitive proximity sensor described above according to the first embodiment, the output from the C-V conversion circuit 21 in the sense circuit unit 20 is either the second capacitance value indicative of the capacitance sensed with the sensor electrode 11 and the auxiliary electrode 13 or the first capacitance value indicative of the capacitance sensed only with the sensor electrode 11. Therefore, the detected capacitance value may vary in accordance with the structure and so forth around the installation place of (the sensor unit 10 containing) the sensor electrode 11.

In such the case, the comparison result from the comparison between the first and second capacitance values may vary depending on the structure and so forth around the place of installing the sensor electrode 11. To avoid such the situation, the sense circuit unit 20 may be configured as follows.

FIG. 9 is a brief diagram showing an example of the entire configuration of a capacitive proximity sensor according to a second embodiment of the present invention. FIG. 10 is a brief diagram showing another example of the entire configuration of the same capacitive proximity sensor. FIG. 11 is a flowchart showing an example of the proximity sense process in the second embodiment. Hereinafter, the parts overlapping those already described are denoted with the same reference numerals and omitted from the following description, and the parts particularly irrelevant to the present invention may be not described clearly.

As shown in FIG. 9, the sense circuit unit 20 in this example comprises the C-V conversion circuit 21 and the shield drive circuit 24 described above and additionally a decision circuit 25 including a CPU and so forth, an initial capacitance storage device 26 operative to store a capacitance value (initial capacitance) in the absence of the proximity of a sense target such as a human body, a switch control circuit 27 operative to control switching in the change-over switch 30, and a buffer 28.

Operation of the sense circuit unit 20 thus configured is outlined as follows. For example, the sensor unit 10 is located at a certain installation place, then the capacitance values (initial capacitances) in the absence of the proximity of a sense target to the sensor unit 10 in operation 1 and operation 2 are switched through the change-over switch 30 under the control of the switch control circuit 27 and detected. These values are stored in the initial capacitance storage device 26, and the decision circuit 25 subtracts these initial capacitances stored in the initial capacitance storage device 26 from the first and second capacitance values on actual operation 1 and operation 2 described above and compares to decide whether or not a sense target exists within the range of the sense region based on the comparison result.

Specifically, the above initial capacitances are stored in the initial capacitance storage device 26 as a first initial capacitance, which is one in the above operation 1 when the change-over switch 30 is connected to the shield drive circuit 24, and a second initial capacitance, which is one in the above operation 2 when the change-over switch 30 is connected to the C-V conversion circuit 21, under the control of the switch control circuit 27.

The decision circuit 25 subtracts the first initial capacitance stored in the initial capacitance storage device 26 from the detected first capacitance value on the actual operation 1 to yield a first detection value (detection value 1) and subtracts the second initial capacitance stored in the initial capacitance storage device 26 from the detected second capacitance value on the actual operation 2 to yield a second detection value (detection value 2).

Namely, as shown in FIG. 11, the first detection value and the second detection value as described above are detected first (step S201), which are then compared at the decision circuit 25 to derive a comparison value (step S202). Based on the first detection value or the second detection value, the control decides whether or not a sense target approaches (step S203). The control also decides whether or not the comparison value between the first detection value and the second detection value is equal to or higher than a predetermined threshold (alternatively equal to or lower than the threshold, or lower than the threshold) (step S206). In a word, it decides whether or not a sense target locates within the range of the sense region based on the detection values 1, 2 and the comparison value. The detection value 2 on the above operation 2 when the sensor electrode 11 and the auxiliary electrode 13 are connected to the C-V conversion circuit 21 is a detection value in the absence of directivity of the sensor, or the output depending on the proximity of the sense target to the sensor unit 10.

If it is decided that the sense target approaches (Y at step S203) and that the comparison value is equal to or higher than the threshold (Y at step S206), then the control decides that the sense target is sensed (step S207).

On the other hand, if it is decided that the sense target approaches (Y at step S203) though that the comparison value is not equal to or higher than the threshold (N at step S206), then the control decides that any sense target is not sensed (step S204) and provides a disable signal indicative of the absence of a sense target within the range of the sense region having directivity, or a not-sensed signal A (such as high impedance or a certain fixed voltage), as a decision output.

In addition, based on the first or second detection value (or the first or second capacitance value C1, C2), the control decides whether or not a sense target approaches (step S203). If it is decided that no sense target approaches (N at step S203), then the control jumps to the step S204, then decides that any sense target is not sensed and provides a disable signal indicative of the absence of a sense target within the range of the sense region of the sensor electrode 11, or a not-sensed signal B, as a decision output.

After the decision of the sense target sensed or not-sensed (after step S204 or S207), the control decides whether or not to terminate the process (step S205). If it is decided to terminate the process (Y at step S205), the control terminates a series of proximity sense processes in accordance with the present flowchart.

If it is decided not to terminate the process (N at step S205), the control jumps to the above step S201 and repeats the subsequent processes.

Thus, the output from the decision circuit 25 is used as the enable signal and the disable signal in accordance with the decision result, thereby feeding the enable signal to the buffer 28 when a sense target locates within the range of the sense region, and providing the detection signal 1 from the buffer 28. When no sense target locates within the range of the sense region, the decision output is fixed as the disable signal at a certain fixed voltage such as the ground voltage and a reference voltage, or turned into the output of high impedance. When a sense target locates within the range of the sense region, the detection signal 1 and additionally the detection signal 2, the first or second capacitance value may be provided. The detection signal 1, the detection signal 2, and the first and second capacitance values indicate the value corresponding to the distance from the sense target to the sensor electrode 11.

Thus, when a sense target locates within the range of the sense region, the above-configured sense circuit unit 20 provides a detection value in accordance with the distance. In addition, when no sense target locates within the range of the sense region, it provides the output of a certain voltage or the like. Accordingly, it is made possible to decide whether or not a sense target locates within the range of the sense region and, if it locates, how long the distance is. Namely, it is possible for the capacitive proximity sensor 100 to enhance the strength of the directivity higher or set the directivity in more detail.

Another example of the method for avoiding the dependence on the structure and so forth around the place of installing the sensor electrode 11 is one that adjusts the reference voltage as follows, thereby holding these. Namely, as shown in FIG. 10, the sense circuit unit 20 in this example comprises the C-V conversion circuit 21 and the shield drive circuit 24 and additionally a reference voltage adjustment circuit 40 and a subtraction circuit 31.

The reference voltage adjustment circuit 40 is operative to adjust the output from the C-V conversion circuit 21 to meet the reference voltage on initial capacitance measurement of the first and second initial capacitances as described above and includes a comparator 41, a control circuit 42, a register 43, a D/A converter 44, and an adjustment unit 45.

In the reference voltage adjustment circuit 40, the comparator 41 receives the output from the C-V conversion circuit 21 at the plus input terminal and the reference voltage RV at the minus input terminal, for example, to compare both and, under the control of the control circuit 42 based on the comparison result, changes the setting in the register 43.

The output from the register 43 is converted at the D/A converter 44 from a digital signal to an analog signal, which is then voltage-adjusted at the adjustment unit 45. The output from the adjustment unit 45 is used to adjust the input to the C-V conversion circuit 21. Thus, in operation 1 in the absence of the proximity of a sense target to the sensor unit 10, the setting in the register 43 is fixed when the output from the C-V conversion circuit 21 reaches the reference voltage as close as possible, thereby determining the output of the first initial capacitance at the reference voltage, and the setting (setting 1) at that time is stored. In addition, in operation 2 in the absence of the proximity of a sense target to the sensor unit 10, the setting in the register 43 is fixed when the output from the C-V conversion circuit 21 reaches the reference voltage as close as possible, thereby determining the output of the second initial capacitance at the reference voltage, and the setting (setting 2) at that time is stored.

In actual operation 1, the output from the C-V conversion circuit 21 when the register 43 is fixed at the setting 1 is fed to the plus input terminal of the subtraction circuit 31 and the reference voltage RV to the minus input terminal, for example, to provide the output as the detection value 1, from which the reference voltage RV is subtracted. In actual operation 2, the output from the C-V conversion circuit 21 when the register 43 is fixed at the setting 2 is fed to the plus input terminal of the subtraction circuit 31 and the reference voltage RV to the minus input terminal, for example, to provide the output as the detection value 2, from which the reference voltage RV is subtracted. These detection values 1 and 2 are then compared similarly to decide whether or not a sense target locates within the range of the sense region and, if it locates, how long the distance is. The adjustment of the input to the C-V conversion circuit 21 can be achieved by, for example, applying a voltage from the D/A converter 44 to the adjustment unit 45 including a fixed condenser and so forth connected to the input, thereby increasing/decreasing the input capacitance.

FIG. 12 is a brief diagram showing an example of the entire configuration of a capacitive proximity sensor according to a third embodiment of the present invention. FIG. 13 is an illustrative view for illustrating the operational concept on sensing in the same capacitive proximity sensor. FIGS. 14-16 provide illustrative views for illustrating relations between a sense target and lines of electrical force on first sensing (operation 3) in the same capacitive proximity sensor.

FIGS. 17-19 provide illustrative views for illustrating relations between a sense target and lines of electrical force on second sensing (operation 4) in the same capacitive proximity sensor. The parts overlapping those already described in the first embodiment may be omitted from the following description.

As shown in FIG. 12, a capacitive proximity sensor 100A according to the second embodiment comprises a sensor unit 10 and a sense circuit unit 20 similar to the capacitive proximity sensor 100 according to the first embodiment. The sensor unit 10 includes a sensor electrode 11, a shield electrode 12, and an auxiliary electrode 13A formed in the shape of a rectangular ring surrounding the sensor electrode 11, similar to the above-described auxiliary electrode 13.

The sensor electrode 11 is provided to mainly sense a sense target that exists within a sense region on the sense surface. The shield electrode 12 exerts the above-described effect. The auxiliary electrode 13A is provided to mainly vary equicapacitance lines (planes) on the sense surface of the sensor electrode 11.

The sense circuit unit 20 includes a C-V conversion circuit 21 connected to the sensor electrode 11 or the auxiliary electrode 13A, an A/D converter 22, a CPU 23, and a shield drive circuit 24 connected to the shield electrode 12 directly and connected to the sensor electrode 11 or the auxiliary electrode 13A.

The sense circuit unit 20 also includes a first change-over switch SW1 operative to switch between the connections of the input from the sensor electrode 11 with the C-V conversion circuit 21 and the shield drive circuit 24, and a second change-over switch SW2 operative to switch between the connections of the input from the auxiliary electrode 13A with the shield drive circuit 24 and the C-V conversion circuit 21. These first and second change-over switches SW1, SW2 are configured switchable between A-side and B-side (see FIG. 12, for example).

The C-V conversion circuit 21 converts a capacitance detected with the sensor electrode 11 or with the auxiliary electrode 13A into a voltage. The A/D converter 22 operates in the similar manner as above. The CPU 23 exerts control over the entire of the capacitive proximity sensor 100A and additionally controls, for example, operation of alternate connection (alternative connection to A-side or B-side) in the first and second change-over switches SW1, SW2 and decides the detection of a sense target (the proximity or the presence/absence of a sense target) within the sense region. The shield drive circuit 24 drives the shield electrode 12, the auxiliary electrode 13A or the sensor electrode 11 at equipotential as the sensor electrode 11.

The structure and configuration of the sensor unit 10 and the sense circuit unit 20 and the structure and configuration of the electrodes 11-13A are similar to those described in the first embodiment and omitted from the following description. The first change-over switch SW1 may be configured to make the sensor electrode 11 open, grounded, or connected to a certain fixed potential when the sensor electrode 11 is not connected to the C-V conversion circuit 21. The second change-over switch SW2 may be configured to make the auxiliary electrode 13A open, grounded, or connected to a certain fixed potential when the sensor electrode 11 is connected to the C-V conversion circuit 21.

The shield drive circuit 24 may be configured to apply an equipotential as that on the sensor electrode 11 to the auxiliary electrode 13A or apply an equipotential as that on the auxiliary electrode 13A to the sensor electrode 11. The first change-over switch SW1 may be configured to connect the sensor electrode 11 to the shield drive circuit 24 when the sensor electrode 11 is not connected to the C-V conversion circuit 21. The second change-over switch SW2 may be configured to connect the auxiliary electrode 13A to the shield drive circuit 24 when the sensor electrode 11 is connected to the C-V conversion circuit 21.

The shield drive circuit 24 may be configured to apply an equipotential as that on the sensor electrode 11 to the auxiliary electrode 13A. The first change-over switch SW1 may be configured to make the auxiliary electrode 13A open, grounded, or connected to a certain fixed potential when the sensor electrode 11 is not connected to the C-V conversion circuit 21. The second change-over switch SW2 may be configured to connect the auxiliary electrode 13A to the shield drive circuit 24 when the sensor electrode 11 is connected to the C-V conversion circuit 21.

The shield drive circuit 24 may be configured to apply an equipotential as that on the auxiliary electrode 13A to the sensor electrode 11. The first change-over switch SW1 may be configured to connect the auxiliary electrode 13A to the shield drive circuit 24 when the sensor electrode 11 is not connected to the C-V conversion circuit 21. The second change-over switch SW2 may be configured to make the auxiliary electrode 13A open, grounded, or connected to a certain fixed potential when the sensor electrode 11 is connected to the C-V conversion circuit 21.

Operation of the capacitive proximity sensor 100A thus configured is described next. First, under the control of the CPU 23, the first and second change-over switches SW1, SW2 are both switched to A-side to connect the sensor electrode 11 to the C-V conversion circuit 21 and connect the shield electrode 12 and the auxiliary electrode 13A to the shield drive circuit 24. Operation in this case (operation 3) is described.

In the case of operation 3, the connection states of the sensor electrode 11, the shield electrode 12 and the auxiliary electrode 13A with the sense circuit unit 20 in the capacitive proximity sensor 100A are as shown in FIG. 13. Namely, as described above, only the sensor electrode 11 is connected to the C-V conversion circuit 21 while the shield electrode 12 and the auxiliary electrode 13A are connected to the shield drive circuit 24. Accordingly, the capacitance on sense targets X, Y, Y' can be detected only with the sensor electrode 11 at the C-V conversion circuit 21.

The rear surface of the sensor electrode 11 in the sense unit 10 is covered with the shield electrode 12. Therefore, the sensitivity on the rear surface of the sensor electrode 11 is effective to detect only lines of electric force turning thereto from the front surface (sense surface) of the sensor electrode 11 and is considerably lower than that on the front surface. The sense target X is herein described as one that exists within the range of the sense region and the sense targets Y, Y' as those that exist outside the range of the sense region.

As shown in FIG. 14, lines of electric force P directing from the sensor electrode 11 toward the sense target X are less susceptible to lines of electric force P' (shield) directing from the auxiliary electrode 13A.

On the other hand, as shown in FIG. 15, lines of electric force P directing from the sensor electrode 11 toward the sense target Y present almost at equidistance as the sense target X are susceptible to lines of electric force P' (shield) directing from the auxiliary electrode 13A and made smaller than those in the case of the sense target X. Therefore, the sense target Y is weaker than the sense target X in capacitive coupling with the sensor electrode 11.

This makes it possible, in operation 3, to easily identify the sense targets X, Y (that is, distinguish whether they are present within or outside the range of the sense region). In contrast, as shown in FIG. 16, with regard to the sense target Y' present closer to the sensor electrode 11 than the sense target Y, lines of electric force P are same as those toward the sense target X in FIG. 14 and accordingly the C-V conversion circuit 21 provides the same output.

In a word, the sense target X and the sense target Y' locate on an equipotential plane (line) M in FIG. 13 and result in the same detection value (capacitance value) in operation 3. Therefore, it is difficult to identify whether the sense target Y' exists within or outside the range of the sense region only with operation 3. Also in the third embodiment, a decision is made not only with operation 3, and the first capacitance value detected in operation 3 at the C-V conversion circuit 21 or the capacitance value C1 is stored in the CPU 23, similar to the first embodiment.

Next, under the control of the CPU 23, the first and second change-over switches SW1, SW2 are both switched to B-side to connect the auxiliary electrode 13A to the C-V conversion circuit 21 and connect the shield electrode 12 and the sensor electrode 11 to the shield drive circuit 24. Operation in this case (operation 4) is described.

In the case of operation 4, the arrangement showing the connection states of the sensor electrode 11, the shield electrode 12 and the auxiliary electrode 13A with the sense circuit unit 20 in the capacitive proximity sensor 100A corresponds to FIG. 13 except that the switches SW1, SW2 in FIG. 13 are switched to B-side. Accordingly, the arrangement is omitted from the figure and the following description.

In the case of operation 4, only the auxiliary electrode 13A is connected to the C-V conversion circuit 21 in the capacitive proximity sensor 100A and the shield electrode 12 and the sensor electrode 11 are connected to the shield drive circuit 24. Accordingly, the capacitance on the sense targets X, Y, Y' are detected only with the auxiliary electrode 13A at the C-V conversion circuit 21. Various conditions such as arrangement positions of the sense targets X, Y, Y' relative to the sensor unit 10 are similar to those in operation 3.

In the case of operation 4, lines of electric force P' (shield) directing from the sensor electrode 11 toward the sense target X are susceptible to lines of electric force P directing from the auxiliary electrode 13A as shown in FIG. 17. Therefore, the sense target X is weak in capacitive coupling with the auxiliary electrode 13A. Thus, the capacitance value detected at the C-V conversion circuit 21 is smaller than that with the sense target X in operation 3.

On the other hand, as shown in FIG. 18, lines of electric force P' (shield) directing from the sensor electrode 11 toward the sense target Y decrease smaller than those toward the sense target X while lines of electric force P directing from the auxiliary electrode 13A increase larger than those toward the sense target X. Therefore, in the case of operation 4, the sense target Y is strong in capacitive coupling with the auxiliary electrode 13A. Thus, the capacitance value detected at the C-V conversion circuit 21 is larger than that with the sense target Y in operation 3.

As shown in FIG. 19, lines of electric force P directing from the auxiliary electrode 13A toward the sense target Y' are more than lines of electric force P directing from the auxiliary electrode 13A toward the sense target X in FIG. 17 and less susceptible to lines of electric force P' (shield) directing from the sensor electrode 11. Therefore, in operation 4, the output from the C-V conversion circuit 21 is larger for the sense target Y' than the sense target X. The second capacitance value detected in such the operation 4 at the C-V conversion circuit 21 or the capacitance value C2 is stored in the CPU 23.

After the detection of the first and second capacitance values C1, C2 in this way, the capacitance values C1, C2 stored in the CPU 23 are compared. For example, with respect to the above-described sense target X, the first capacitance value C1 in operation 3 is larger than the second capacitance value C2 in operation 4. In contrast, with respect to the sense target Y, the first capacitance value C1 in operation 3 is smaller than the second capacitance value C2 in operation 4. With respect to the sense target Y', the first capacitance value C1 in operation 3 is almost equal to the second capacitance value C2 in operation 4.

Thus, the comparison of the second capacitance value C2 with the first capacitance value C1 at the CPU 23 makes it possible to decide how outward the sense target exists from the center of the sensor electrode 11. In this case, it is possible to decide that the sense target exists within the range of the sense region in the capacitive proximity sensor 100A if the comparison value between the capacitance values C1, C2 is, for example, equal to or higher than a predetermined threshold (alternatively equal to or lower than the threshold, or lower than the threshold). By setting so, it is made possible to achieve arbitrary directivity.

In the illustrative views shown in FIGS. 13-19, the detection value in operation 3 is larger than the detection value in operation 4 for the sense target X, the detection value in operation 3 is smaller than the detection value in operation 4 for the sense target Y, and the detection value in operation 3 is almost equal to the detection value in operation 4 for the sense target Y', as described in the above example. Variations in various conditions such as arrangement shapes and arrangement areas of the sensor electrode and the auxiliary electrode 13A vary the upper/lower relation between operation 3 and operation 4 for the sense targets X, Y, Y'.

A proportion of the second capacitance value C2 in operation 4 to the first capacitance value C1 in operation 3, (C2/C1), can be distinguished because always the sense target X<the sense target Y (or the sense target Y'). Therefore, varying the values in the comparison equations for operation 3 and operation 4 from condition to condition makes it possible to identify the sense targets X, Y, Y'. The comparison equations, comparison values, various coefficients, arbitrary thresholds (Th1, Th2) and so forth are similar to those described in the first embodiment and accordingly omitted from the following description.

Depending on the condition, an equation may not be used for expression. In such the case, the capacitance values C1, C2 at the positions of the sense targets may be previously measured and profiled, and then the profiles may be compared with actual detection values.

Thus, the capacitive proximity sensor 100A described above can achieve high-strength directivity when the above threshold Th2 is larger and low-strength directivity when it is smaller, for example. Accordingly, it is possible to adjust the directivity of the sensor arbitrarily, thereby determining the range of the sense region arbitrarily to sense a sense target reliably with a simple configuration.

Various configurations and actions of the C-V conversion circuit 21 in the sense circuit unit 20 are similar to those described in the first embodiment described above using FIGS. 6 and 7 and accordingly omitted herein from the description. In the capacitive proximity sensor 100A according to the third embodiment, the sensor electrode 11, and the shield electrode 12 and the auxiliary electrode 13A are arranged to compare the capacitance value C1 on the sensor electrode 11 with the capacitance value C2 on the auxiliary electrode 13A to decide the detection of a sense target, as described in the example. The dummy electrode 11' may be arranged and the C-V conversion circuit 21 may operate differentially as described in the first embodiment using FIG. 8. Also with this regard, various configurations and actions are similar to those described above and omitted herein from the description.

As for the modifications of the shield drive circuit 24 and the modifications of the first and second change-over switch SW1, SW2, various configurations and actions are similar to those described in the first embodiment and omitted herein from the description.

In the capacitive proximity sensor 100A according to the third embodiment, the auxiliary electrode 13A is arranged in the state of surrounding the entire circumference of the sensor electrode 11. Therefore, the capacitive proximity sensor 100A has similar directivity in all directions on the sense surface of the sensor electrode 11 (that is, the range of the sense region is similar in any direction to the sensor electrode 11). If there is a direction not intended to have directivity, the following means may be applied.

Namely, the auxiliary electrode 13A is not arranged in the direction not intended to have directivity and the auxiliary electrode 13A may be shaped in a U-shaped, C-shaped, L-shaped or shaped semicircular instead to reduce the directivity in the direction that lacks the presence of the auxiliary electrode 13A.

The output from the C-V conversion circuit 21 in the sense circuit unit 20 is either the first capacitance value or the second capacitance value and accordingly the detected capacitance value may vary depending on the surrounding structure and so forth of the place of installing (the sensor unit 10 containing) the sensor electrode 11.

In such the case, the comparison result from the comparison between the first and second capacitance values may vary depending on the surrounding structure and so forth of the place of installing the sensor electrode 11. To avoid such the situation, the sense circuit unit 20 may be configured as follows.

FIG. 20 is a brief diagram showing another example of the entire configuration of a capacitive proximity sensor according to a fourth embodiment of the present invention. FIG. 21 is a brief diagram showing yet another example of the entire configuration of the same capacitive proximity sensor. The parts overlapping those already described in the second embodiment are denoted with the same reference numerals and omitted from the following description.

As shown in FIG. 20, the sense circuit unit 20 comprises the C-V conversion circuit 21, the shield drive circuit 24, the decision circuit 25, the initial capacitance storage device 26 operative to store the above-described initial capacitances, the switch control circuit 27 operative to control switching in the change-over switches SW1, SW2, and the buffer 28.

Operation of such the sense circuit unit 20 is outlined below. For example, the sensor unit 10 is located at a certain installation place, then the capacitance values (initial capacitances) in the absence of the proximity of a sense target to the sensor unit 10 are switched through the change-over switches SW1, SW2 under the control of the switch control circuit 27 and detected. These values are stored in the initial capacitance storage device 26.

The decision circuit 25 subtracts these initial capacitances stored in the initial capacitance storage device 26 from the first and second capacitance values on actual operations 3, 4 described above and compares to decide whether or not a sense target exists within the range of the sense region based on the comparison result.

Specifically, the above initial capacitances are stored in the initial capacitance storage device 26 as a first initial capacitance, which is one in the above operation 3 when the change-over switches SW1, SW2 are connected to A-side, and a second initial capacitance, which is one in the above operation 4 when the change-over switches SW1, SW2 are connected to B-side, under the control of the switch control circuit 27.

The decision circuit 25 subtracts the first initial capacitance stored in the initial capacitance storage device 26 from the detected first capacitance value on actual operation 3 to yield a first detection value (detection value 1) and subtracts the second initial capacitance stored in the initial capacitance storage device 26 from the detected second capacitance value on operation 4 to yield a second detection value (detection value 2).

Thereafter, the decision circuit 25 compares the detection value 1 with the detection value 2 to decide whether or not a sense target locates within the range of the sense region based on the comparison result. For example, the detection value 1 on the above operation 3 is the output depending on the proximity of a sense target to the sensor unit 10. Subsequent operations, actions, effects and so forth are similar to those described in the second embodiment and omitted herein from the description.

As for the above-described first and second initial capacitances, the voltage on initial capacitance measurement may be digital-converted at the A/D converter or the like and held in a register, a memory or the like though these may be held by adjusting the reference voltage as follows. Namely, as shown in FIG. 21, the sense circuit unit 20 comprises the C-V conversion circuit 21, the shield drive circuit 24, the reference voltage adjustment circuit 40, and the subtraction circuit 31.

The reference voltage adjustment circuit 40 is operative to adjust the output from the C-V conversion circuit 21 to meet the reference voltage on initial capacitance measurement of the first and second initial capacitances as described above and includes the comparator 41, the control circuit 42, the register 43, the D/A converter 44, and the adjustment unit 45. The configurations and actions are similar to those described in the second embodiment and omitted herein from the description.

In the reference voltage adjustment circuit 40, the output of the first and second initial capacitances is determined at the reference voltage. The output from the C-V conversion circuit 21 thus determined at the reference voltage is supplied to the plus input terminal of the subtraction circuit 31 and the reference voltage RV to the minus input terminal to subtract the reference voltage RV from the output to subtract the first and second initial capacitances, thereby deciding whether or not a sense target locates within the range of the sense region and, if it locates, how long the distance is.

DESCRIPTION OF REFERENCE NUMERALS

Figure 1:
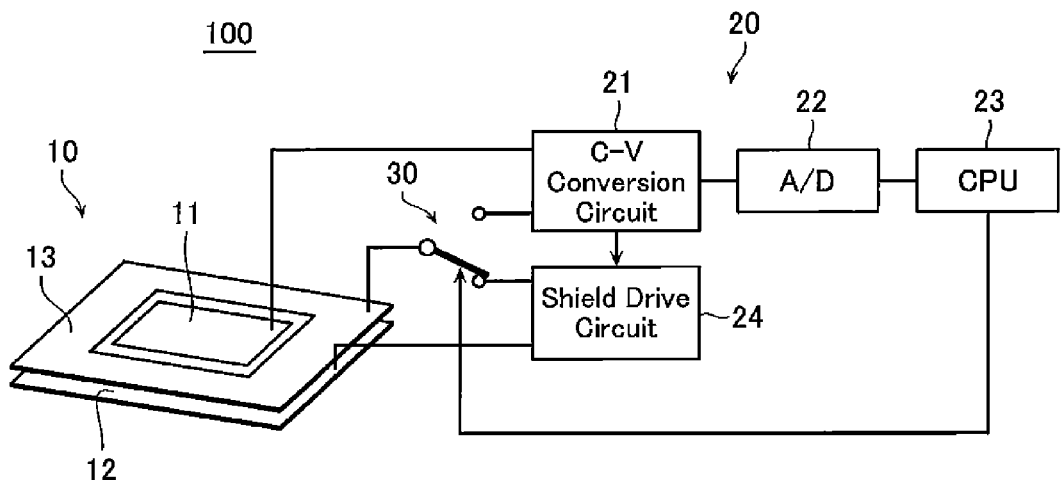
FIG. 1 A brief diagram showing an example of the entire configuration of a capacitive proximity sensor according to a first embodiment of the present invention.
Figure 2:
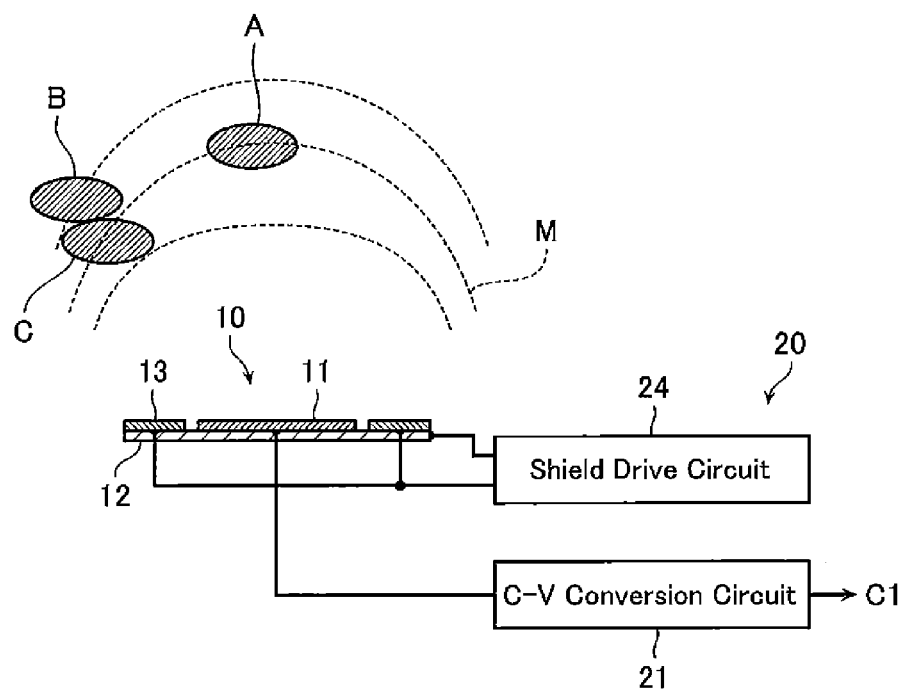
FIG. 2 An illustrative view for illustrating the operational concept on sensing in the same capacitive proximity sensor.
Figure 3A:
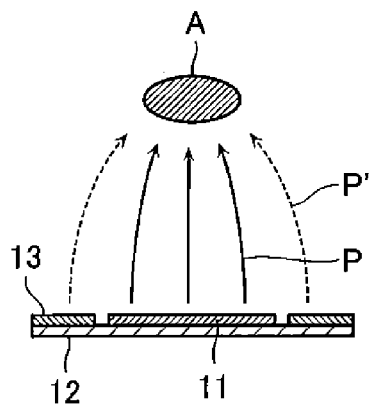
FIG. 3A An illustrative view for illustrating relations between a sense target and lines of electrical force on sensing in the same capacitive proximity sensor.
Figure 3B:
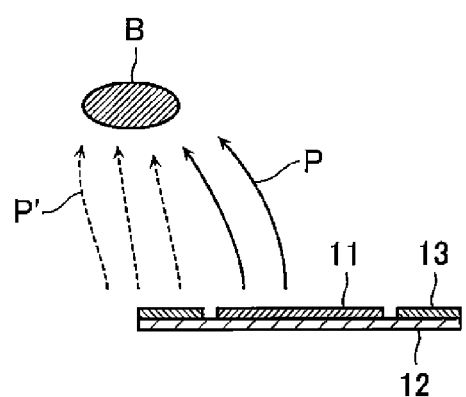
FIG. 3B An illustrative view for illustrating relations between a sense target and lines of electrical force on sensing in the same capacitive proximity sensor.
Figure 4:
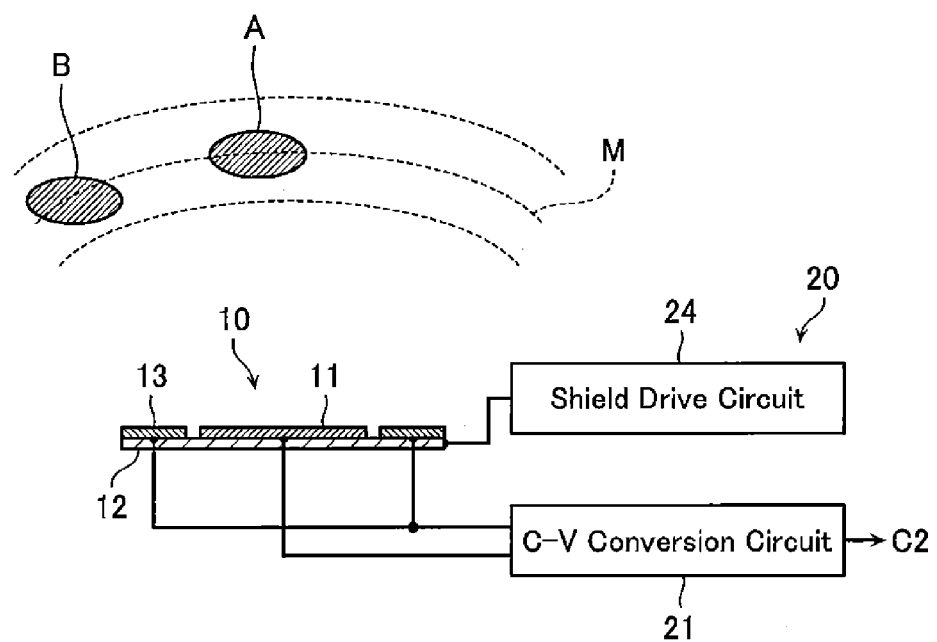
FIG. 4 An illustrative view for illustrating the operational concept on sensing in the same capacitive proximity sensor.
Figure 5:
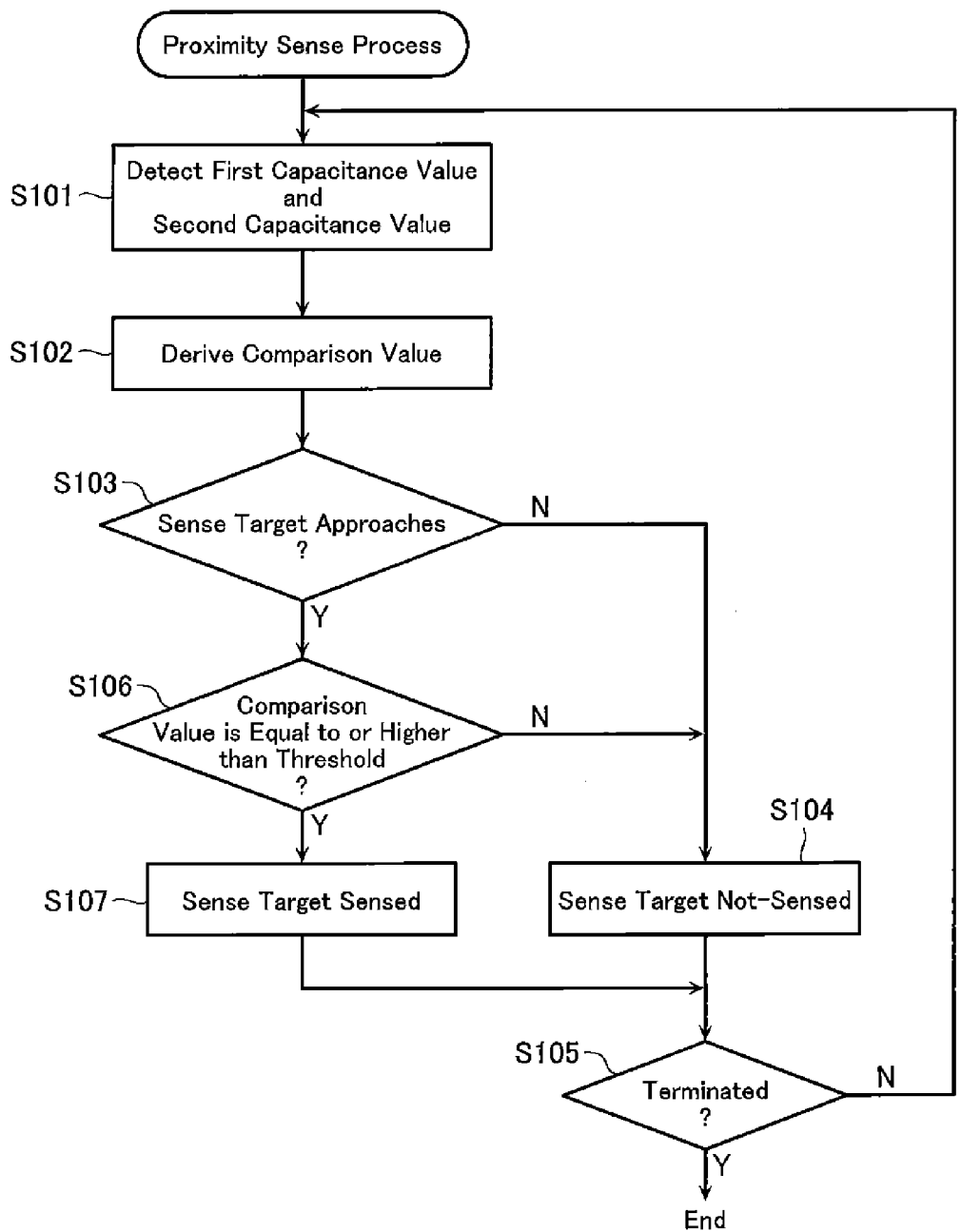
FIG. 5 A flowchart showing an example of the proximity sense process in the same capacitive proximity sensor.
Figure 6:
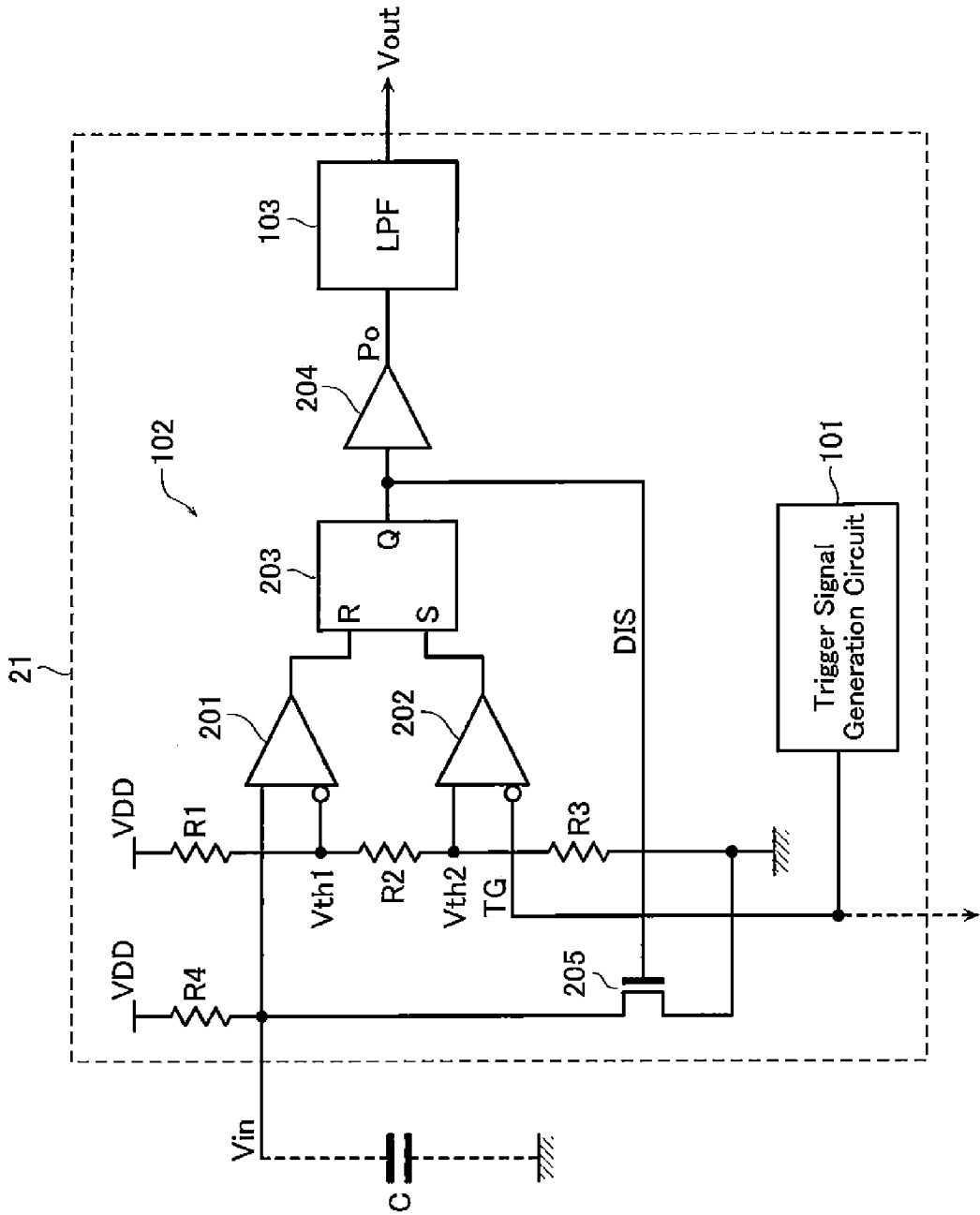
FIG. 6 A block diagram showing a configuration example of a C-V conversion circuit in the same capacitive proximity sensor.
Figure 7:
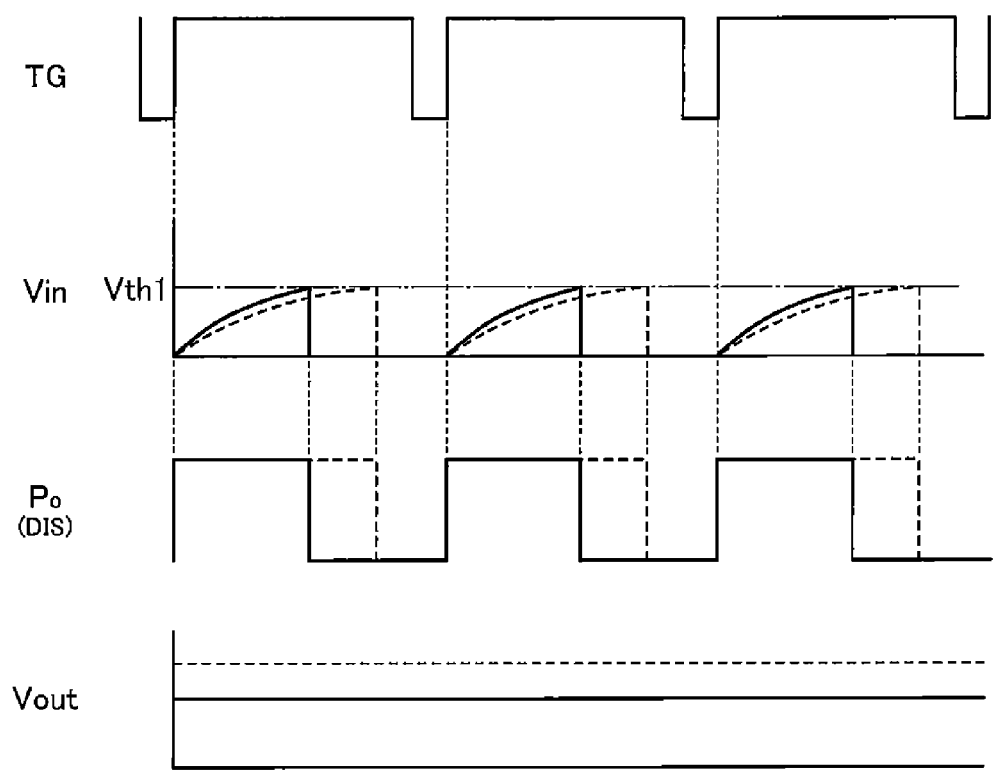
FIG. 7 An operational waveform diagram showing an example of operational waveforms in the C-V conversion circuit in the same capacitive proximity sensor.
Figure 8:
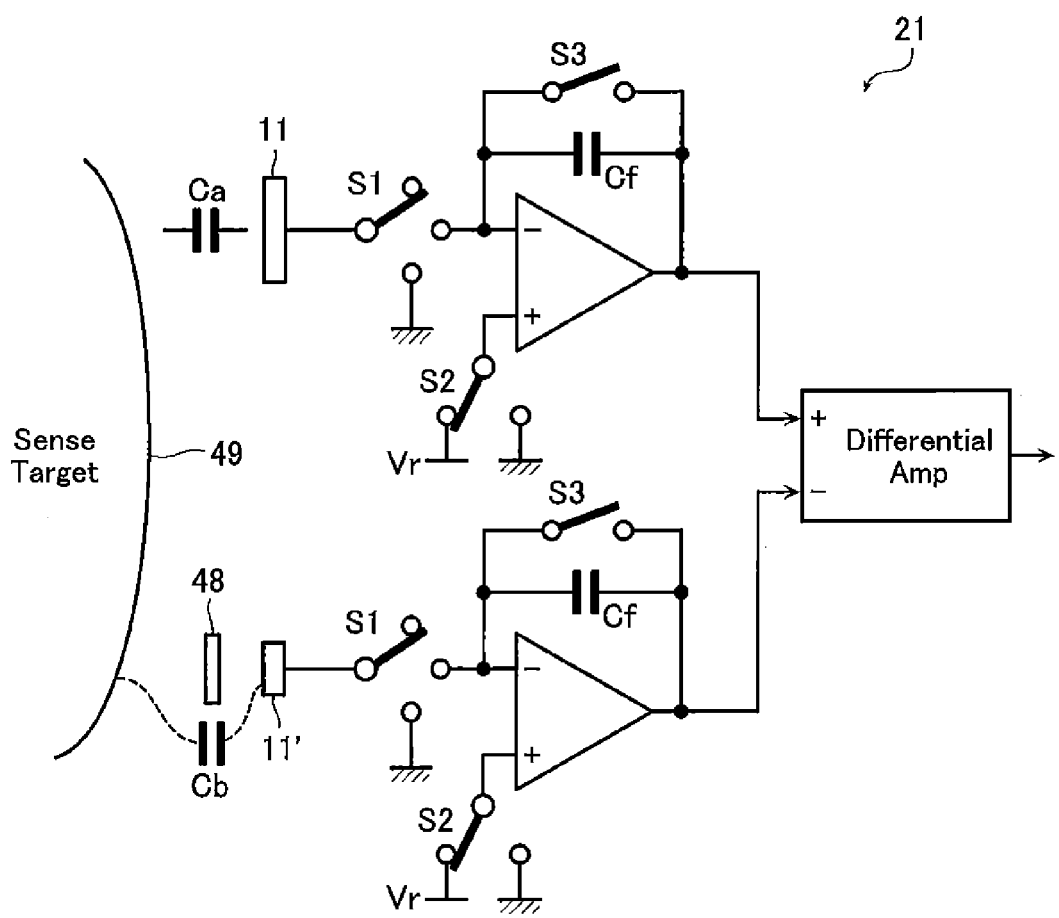
FIG. 8 An illustrative view for illustrating an example of the capacitive proximity sensor having another configuration according to the first embodiment.
Figure 9:
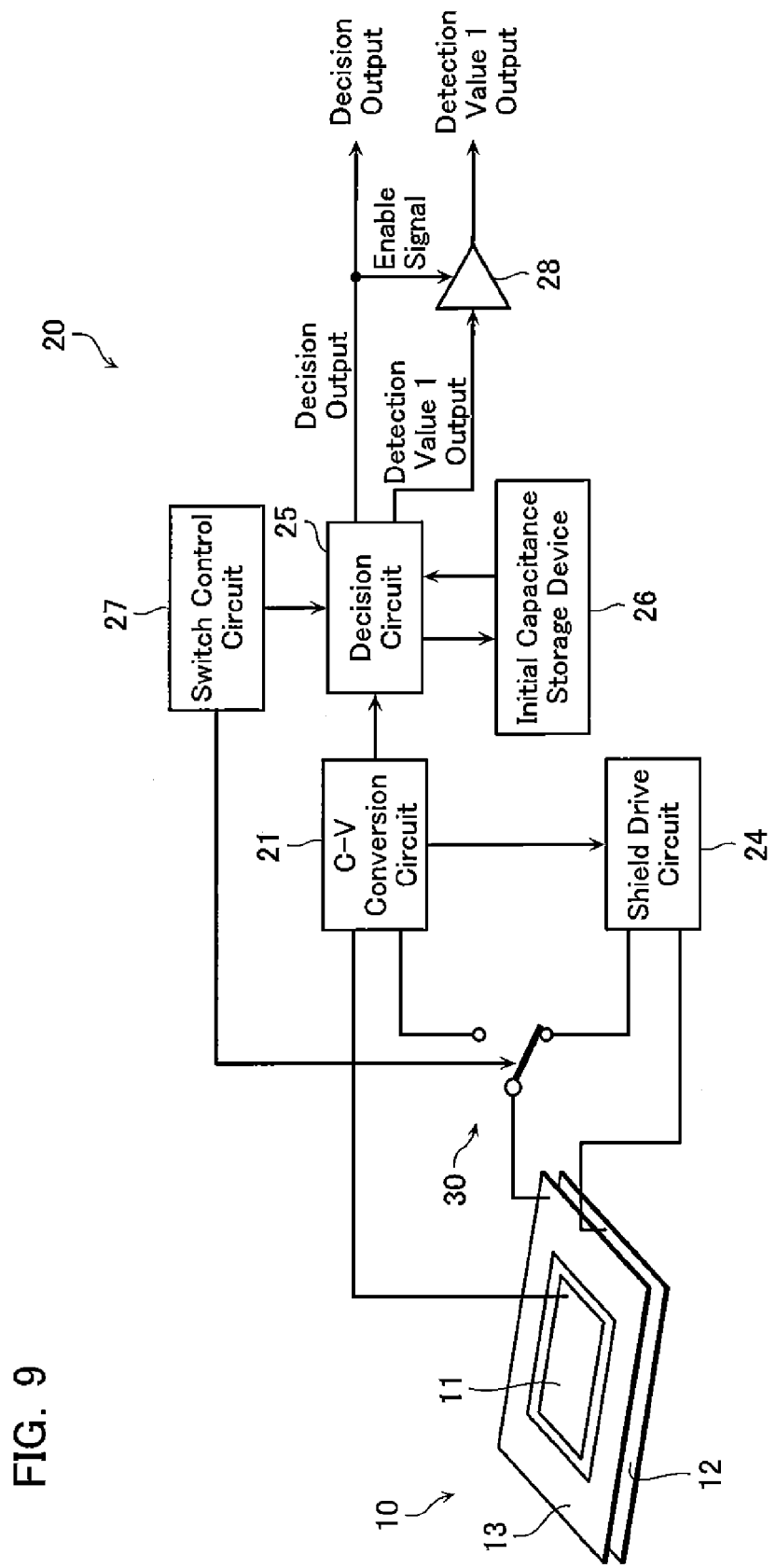
FIG. 9 A brief diagram showing an example of the entire configuration of a capacitive proximity sensor according to a second embodiment of the present invention.
Figure 10:
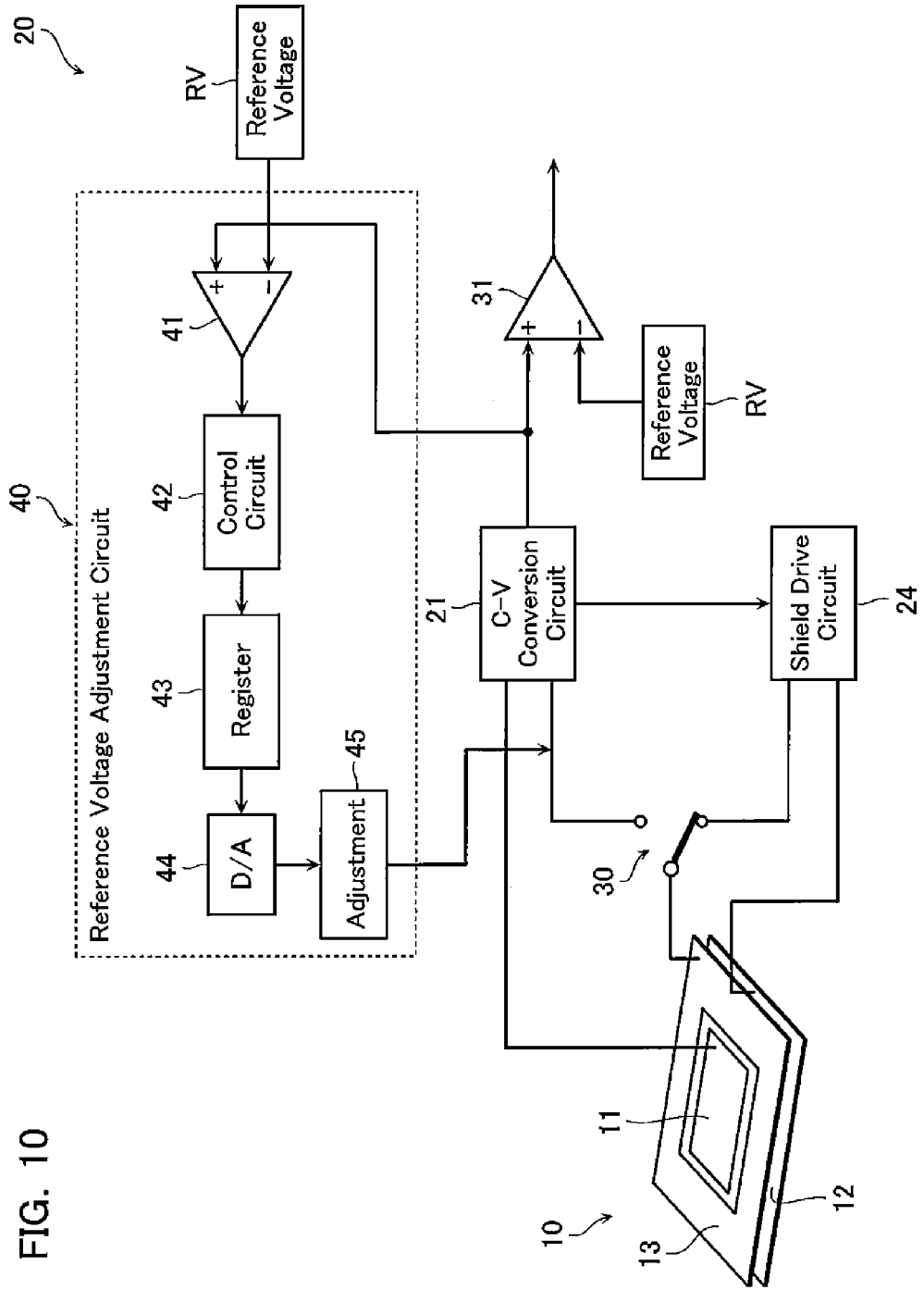
FIG. 10 A brief diagram showing another example of the entire configuration of the same capacitive proximity sensor.
Figure 11:
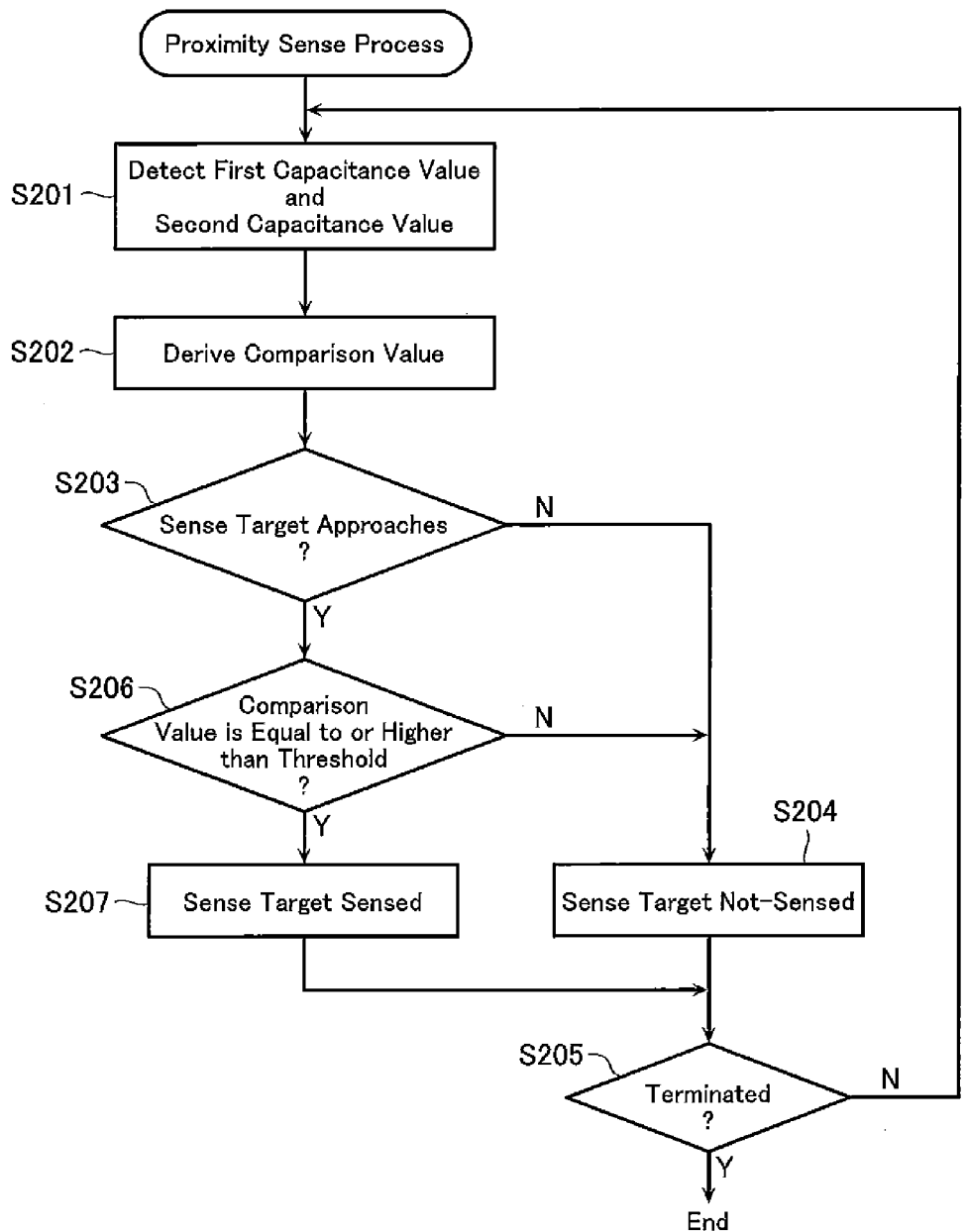
FIG. 11 A flowchart showing an example of the proximity sense process in the same capacitive proximity sensor.
Figure 12:
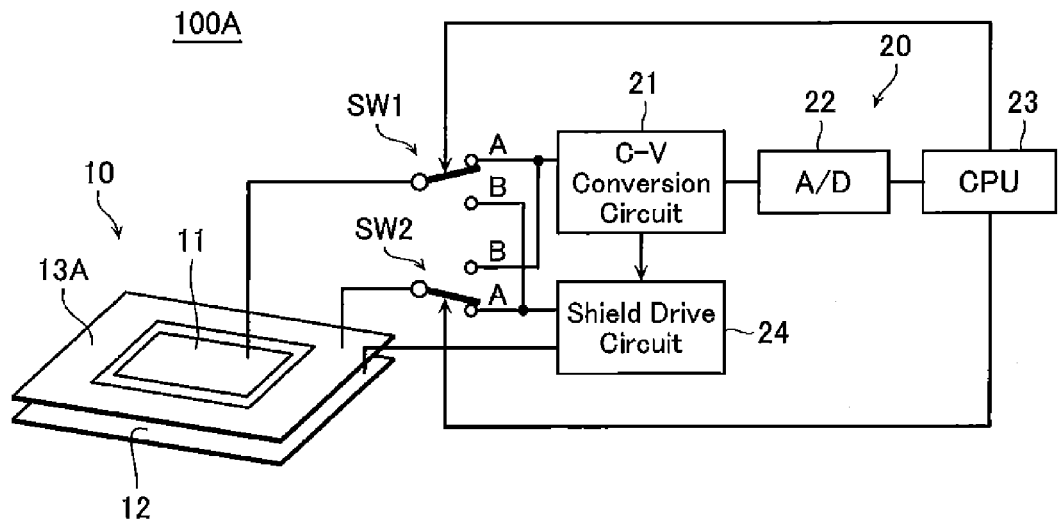
FIG. 12 A brief diagram showing an example of the entire configuration of a capacitive proximity sensor according to a third embodiment of the present invention.
Figure 13:
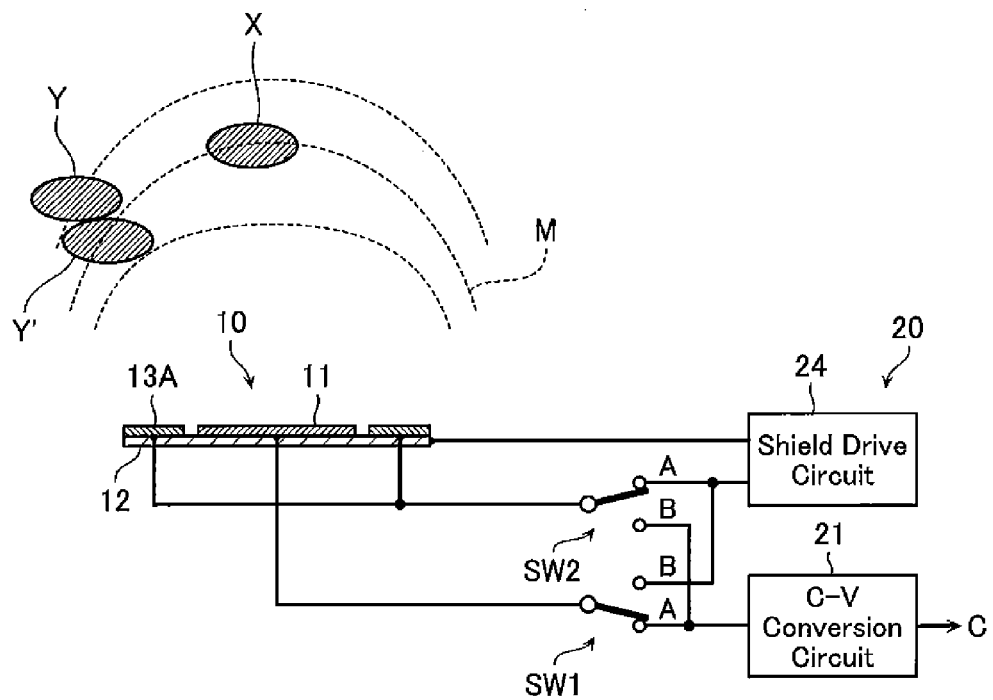
FIG. 13 An illustrative view for illustrating the operational concept on sensing in the same capacitive proximity sensor.
Figure 14:
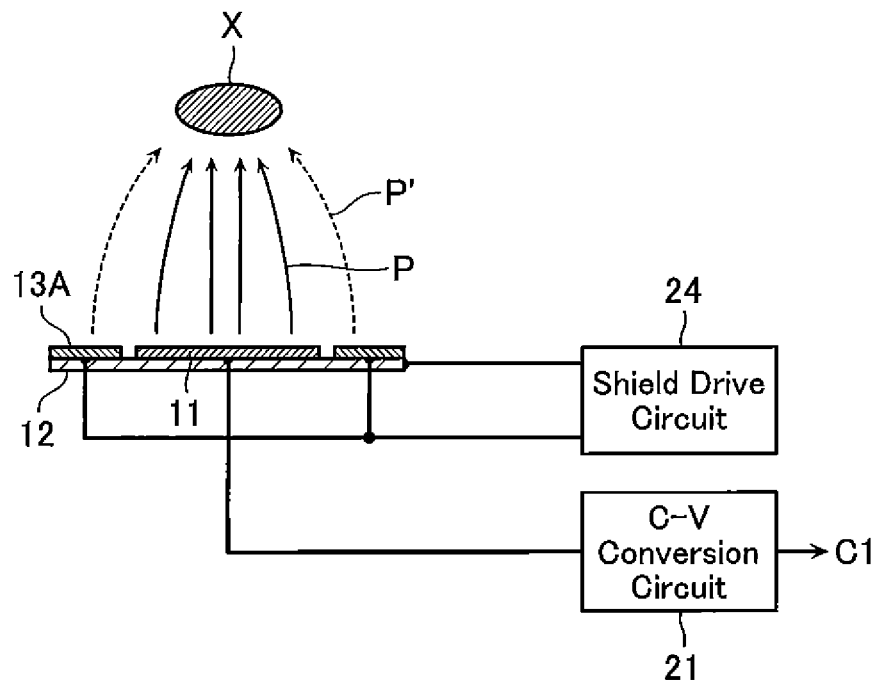
FIG. 14 An illustrative view for illustrating relations between a sense target and lines of electrical force on first sensing in the same capacitive proximity sensor.
Figure 15:
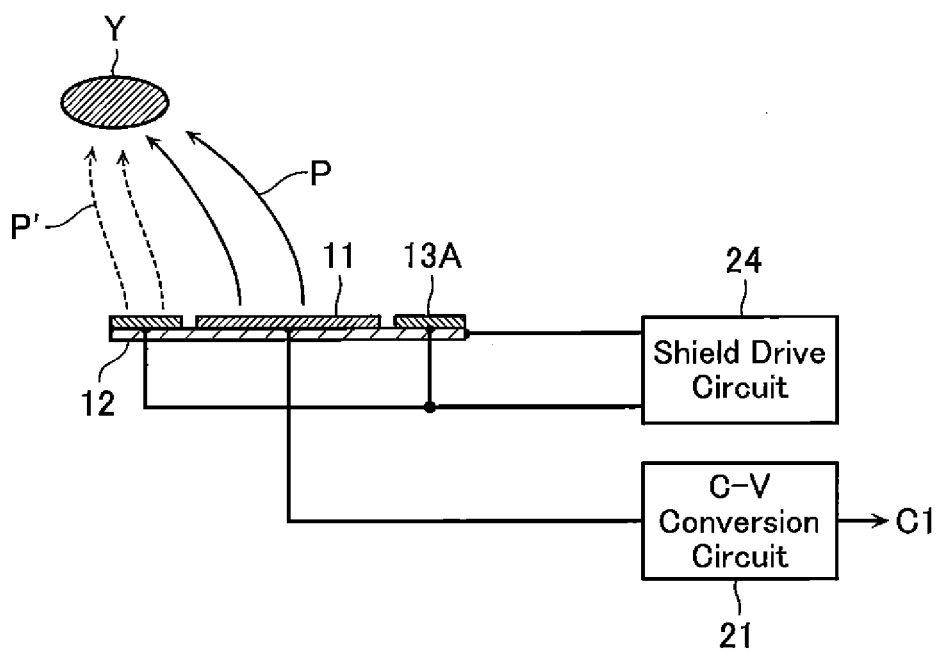
FIG. 15 An illustrative view for illustrating relations between a sense target and lines of electrical force on first sensing in the same capacitive proximity sensor.
Figure 16:
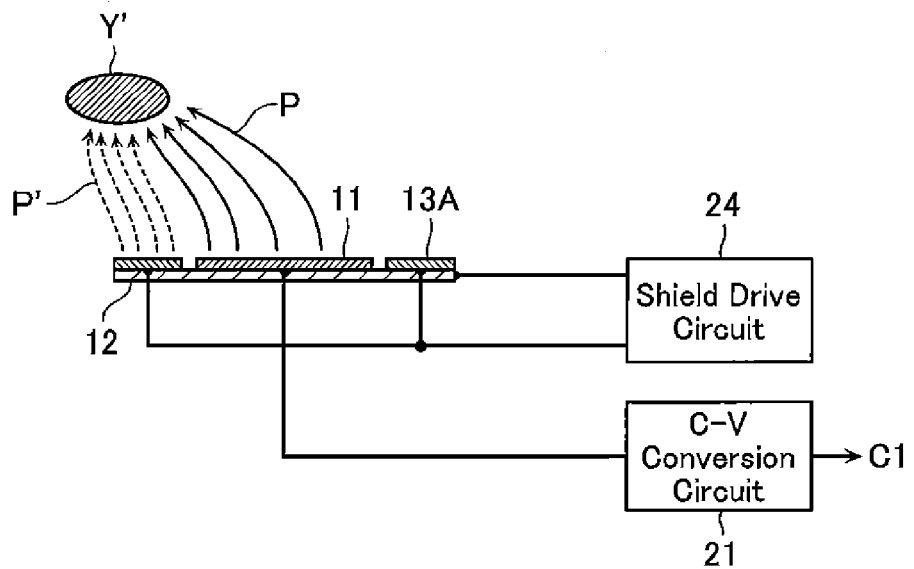
FIG. 16 An illustrative view for illustrating relations between a sense target and lines of electrical force on first sensing in the same capacitive proximity sensor.
Figure 17:
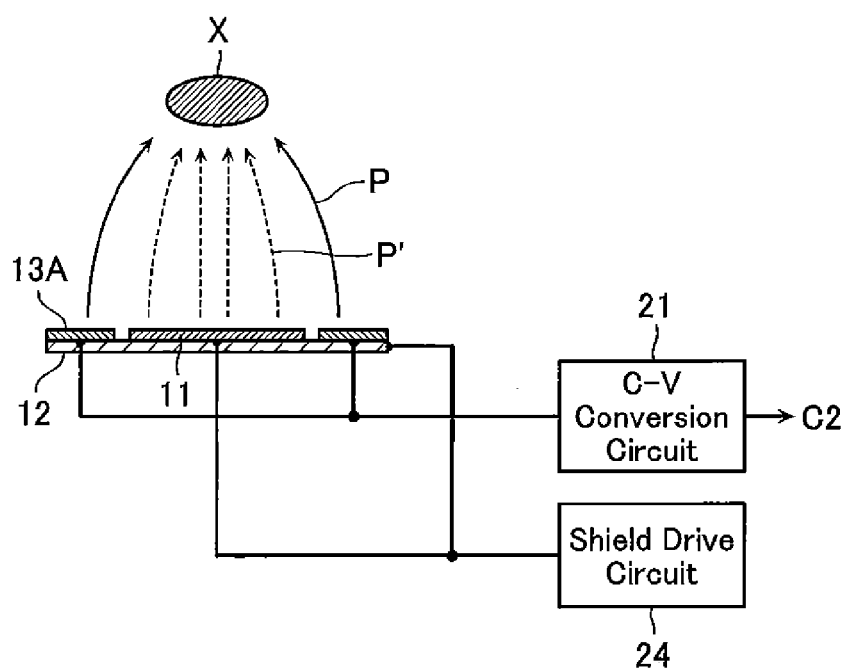
FIG. 17 An illustrative view for illustrating relations between a sense target and lines of electrical force on second sensing in the same capacitive proximity sensor.
Figure 18:
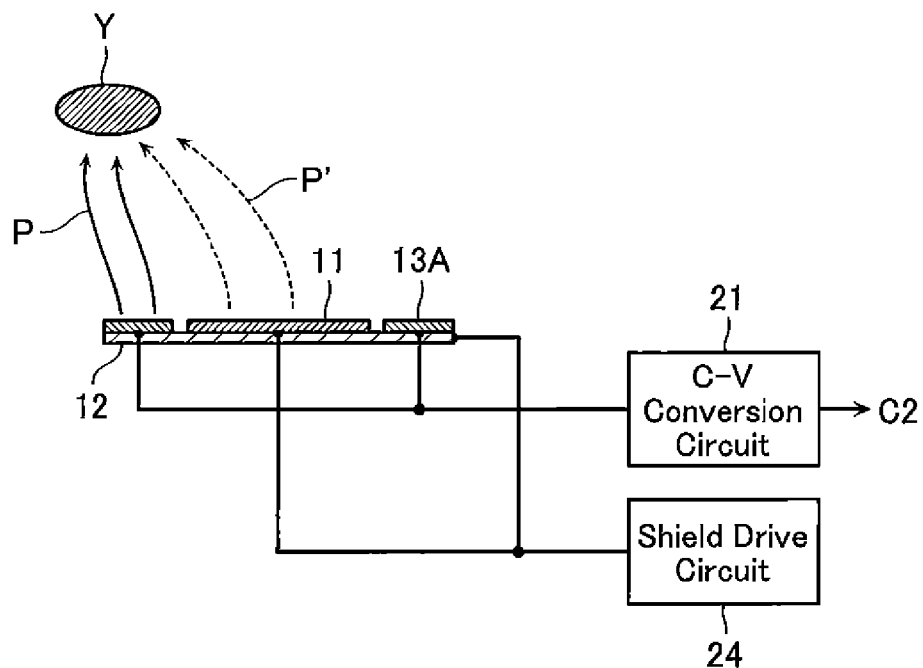
FIG. 18 An illustrative view for illustrating relations between a sense target and lines of electrical force on second sensing in the same capacitive proximity sensor.
Figure 19:
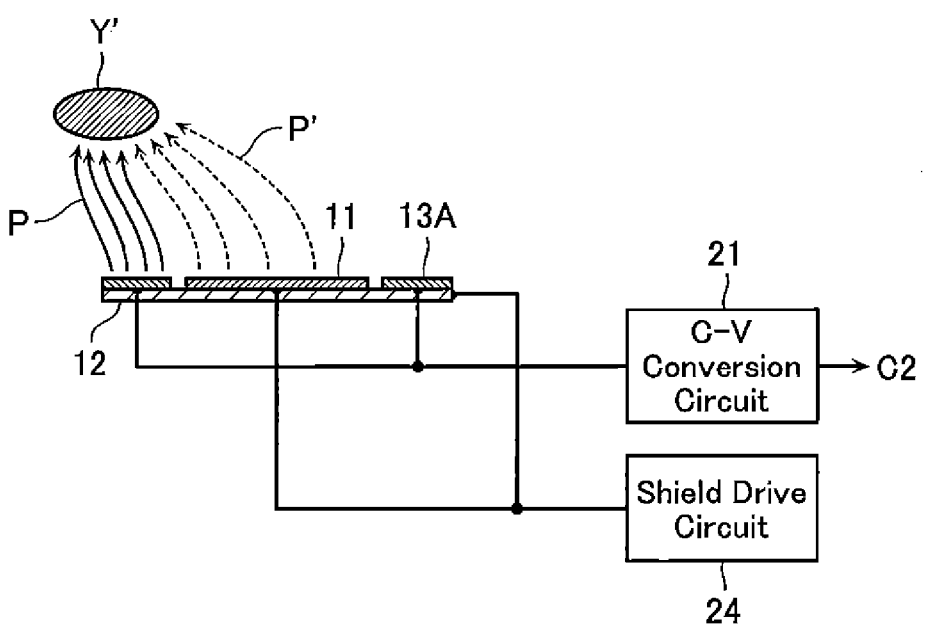
FIG. 19 An illustrative view for illustrating relations between a sense target and lines of electrical force on second sensing in the same capacitive proximity sensor.
Figure 20:
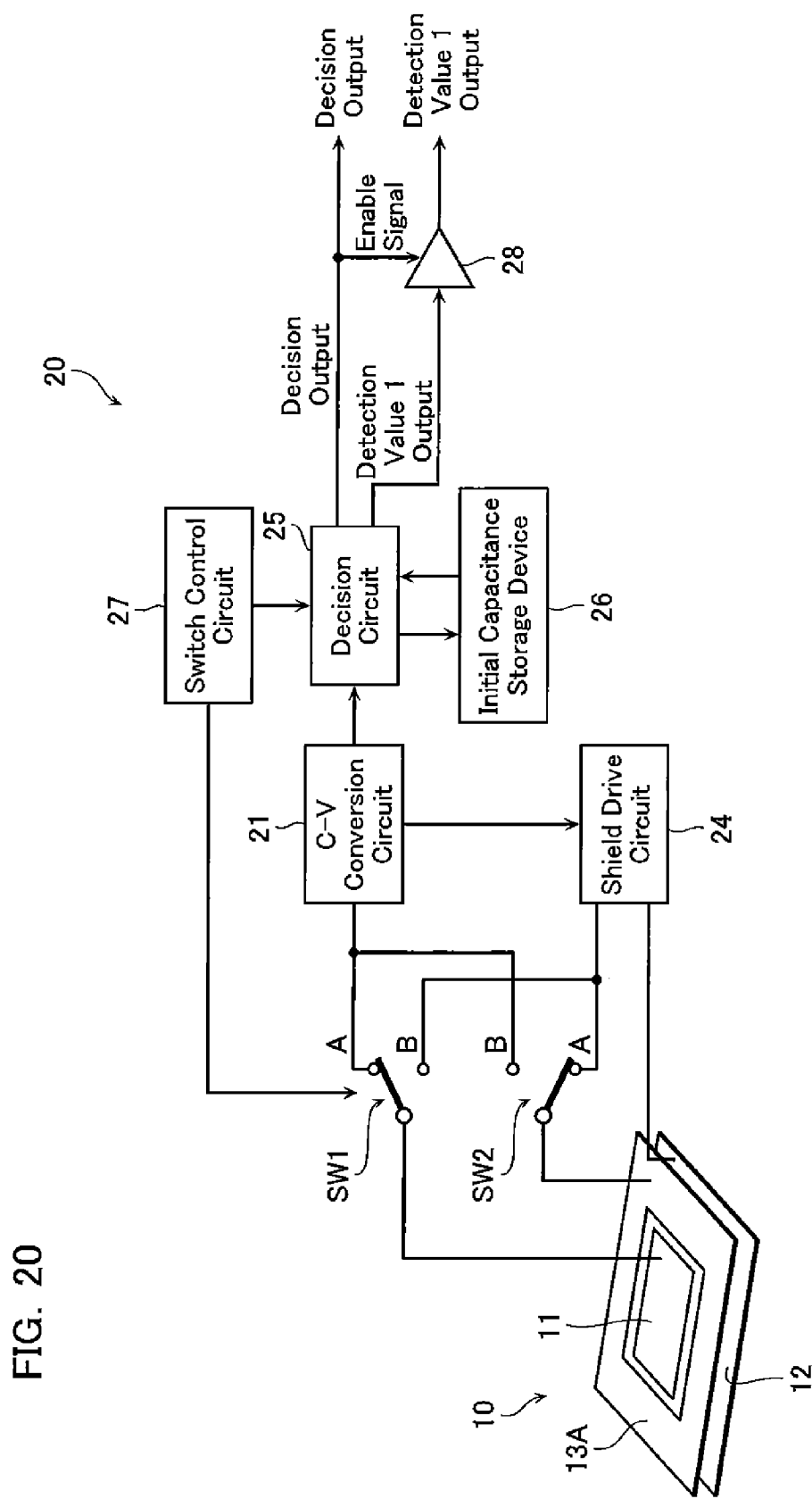
FIG. 20 A brief diagram showing another example of the entire configuration of a capacitive proximity sensor according to a fourth embodiment of the present invention.
Figure 21:
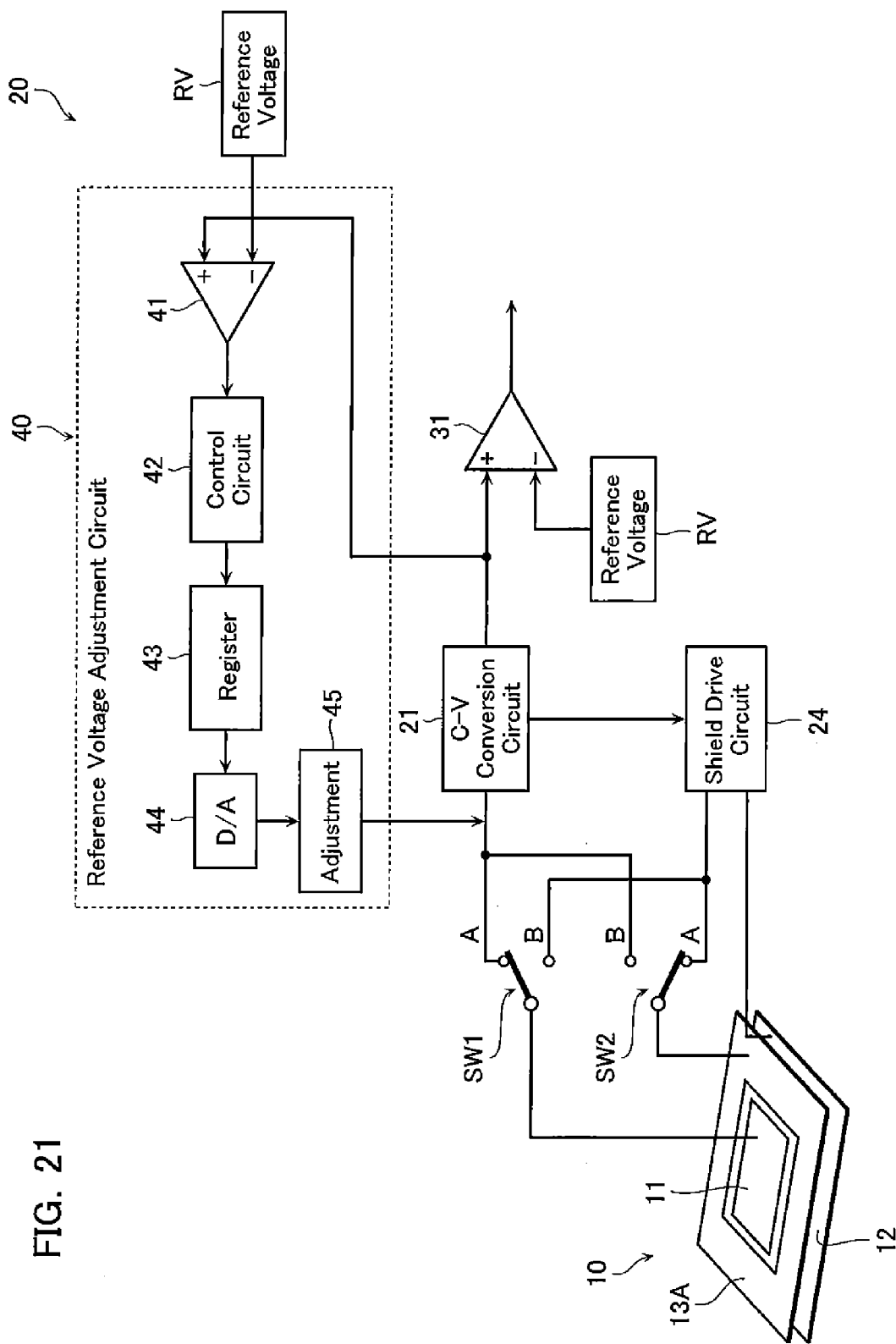
FIG. 21 A brief diagram showing yet another example of the entire configuration of the same capacitive proximity sensor.

10: Sensor Unit, 11: Sensor Electrode, 11': Dummy Electrode, 12: Shield Electrode, 13, 13A: Auxiliary Electrode, 20: Sense Circuit Unit, 21: C-V Conversion Circuit, 22: A/D Converter, 23: CPU, 24: Shield Drive Circuit, 25: Decision Circuit, 26: Initial Capacitance Storage Device, 27: Switch Control Circuit, 30: Change-Over Switch, 31: Subtraction Circuit, 40: Reference Voltage Adjustment Circuit, 41: Comparator, 42: Control Circuit, 43: Register, 44: D/A Converter, 100, 100A: Capacitive Proximity Sensor.

The invention claimed is:

1. A capacitive proximity sensor, comprising:
    a sensor electrode;
    an auxiliary electrode disposed coplanar with the sensor electrode in the vicinity of the sensor electrode;
    a detection circuit connected at least to the sensor electrode and operative to detect a capacitance value based on a capacitance on the connected electrode;
    a change-over switch selectively switching between a first connection state of not connecting the auxiliary electrode to the detection circuit with the sensor electrode being connected to the detection circuit and a second connection state of connecting the auxiliary electrode to the detection circuit with the sensor electrode being connected to the detection circuit; and
    a comparison/decision means operative to compare a first capacitance value from the detection circuit in the first connection state with a second capacitance value from the detection circuit in the second connection state to yield a comparison result, and decide whether or not a sense target locates within a range of a sense region based on the comparison result and the first or second connection state.

2. The capacitive proximity sensor according to claim 1, wherein the change-over switch is configured such that in the first connection state it is capable of making the auxiliary electrode open, grounded, or connected to a certain fixed potential.

3. The capacitive proximity sensor according to claim 1, further comprising a shield drive circuit for applying to the auxiliary electrode an equivalent potential as that on the sensor electrode,
    wherein the change-over switch is configured such that in the first connection state it is capable of connecting the auxiliary electrode to the shield drive circuit.

4. The capacitive proximity sensor according to claim 1, further comprising a shield electrode which is arranged on the rear surface of the sensor electrode, the rear surface of the sensor electrode being a surface opposing a sense surface of the sensor electrode, and which is insulated from the sensor electrode to shield the sensor electrode from sensing on the rear surface.

5. The capacitive proximity sensor according to claim 1, wherein the auxiliary electrode is arranged on the same plane as the sense surface of the sensor electrode and insulated from the sensor electrode.

6. The capacitive proximity sensor according to claim 1, wherein the auxiliary electrode is arranged around the sensor electrode.

7. The capacitive proximity sensor according to claim 6, wherein the auxiliary electrode is arranged concentric with the sensor electrode.

8. The capacitive proximity sensor according to claim 1, wherein the comparison/decision means divides the first capacitance value by the second capacitance value and multiplies the quotient by a certain coefficient to yield a comparison value, and identifies whether or not the comparison value is equal to or higher than a predetermined threshold to decide whether or not a sense target locates within the range of the sense region.

9. The capacitive proximity sensor according to claim 1, further comprising a dummy electrode having a sense surface covered with a shield electrode,
wherein the detection circuit is configured operable differentially, wherein one input terminal of the detection circuit is connected to the sensor electrode directly or via the first change-over switch, and the other input terminal of the detection circuit is connected to the dummy electrode.

10. The capacitive proximity sensor according to claim 9, wherein the dummy electrode is formed such that the area of the electrode surface is half the area of the sense surface of the sensor electrode or below.

11. The capacitive proximity sensor according to claim 1, wherein the detection circuit further detects a first initial capacitance or an initial capacitance of the first capacitance value with no sense target locating within the range of the sense region, and a second initial capacitance or an initial capacitance of the second capacitance value with no sense target locating within the range of the sense region,
wherein the comparison/decision means compares a first detection value obtained by subtracting the first initial capacitance from the first capacitance value with a second detection value obtained by subtracting the second initial capacitance from the second capacitance value to yield a comparison result, and decides whether or not a sense target exists within the range of the sense region based on the comparison result and the first or second detection value.

12. The capacitive proximity sensor according to claim 1, further comprising a reference voltage adjustment means for setting the output from the detection circuit at a reference voltage,
wherein the detection circuit is configured to acquire a first setting for adjusting to the reference voltage the first initial capacitance or an initial capacitance of the first capacitance value with no sense target locating within the range of the sense region, and a second setting for adjusting to the reference voltage the second initial capacitance or an initial capacitance of the second capacitance value with no sense target locating within the range of the sense region, and provide a first capacitance value adjusted with the first setting and a second capacitance value adjusted with the second setting,
wherein the comparison/decision means uses as the first detection value the quotient obtained by subtracting the reference voltage from the first capacitance value adjusted with the first setting, and as the second detection value the quotient obtained by subtracting the reference voltage from the second capacitance value adjusted with the second setting, then compares both to yield a comparison result, and decides whether or not a sense target exists within the range of the sense region based on the comparison result and the first or second detection value.

13. The capacitive proximity sensor according to claim 1, wherein the comparison/decision means provides a signal in accordance with the distance from the sense target to the sensor when it decides that a sense target locates within the range of the sense region based on either value of the first capacitance value, the second capacitance value, the first detection value and the second detection value, wherein the comparison/decision means sets the output at a certain fixed voltage when it decides that no sense target locates within the range of the sense region.

14. The capacitive proximity sensor according to claim 13, wherein the certain fixed voltage is the ground voltage or the reference voltage.

15. The capacitive proximity sensor according to claim 1, wherein the comparison/decision means provides a signal in accordance with the distance from the sense target to the sensor electrode when it decides that a sense target locates within the range of the sense region based on either value of the first capacitance value, the second capacitance value, the first detection value and the second detection value, wherein the comparison/decision means sets the output at high impedance when it decides that no sense target locates within the range of the sense region.

16. A capacitive proximity sensor, comprising:
a sensor electrode;
an auxiliary electrode disposed coplanar with the sensor electrode in the vicinity of the sensor electrode;
a detection circuit connected to the sensor electrode and operative to detect a capacitance value based on a capacitance on the sensor electrode;
a shield drive circuit for applying to the auxiliary electrode an equivalent potential as that on the sensor electrode;
a change-over switch selectively switching between a first connection state of connecting the auxiliary electrode to the shield drive circuit with the sensor electrode being connected to the detection circuit and a second connection state of making the auxiliary electrode open, grounded, or connected to a certain fixed potential with the sensor electrode being connected to the detection circuit; and
a comparison/decision means operative to compare a first capacitance value from the detection circuit in the first connection state with a second capacitance value from the detection circuit in the second connection state to yield a comparison result, and decide whether or not a sense target locates within a range of a sense region based on the comparison result and the first or second connection state.

17. A capacitive proximity sensor, comprising:
a sensor electrode;
an auxiliary electrode disposed coplanar with the sensor electrode in the vicinity of the sensor electrode;
a detection circuit operative to detect a capacitance value based on a capacitance on the connected electrode;
a first change-over switch selectively switching between a first connection state of connecting the sensor electrode to the detection circuit and a second connection state of not connecting the sensor electrode to the detection circuit;
a second change-over switch not connecting the auxiliary electrode to the detection circuit when the sensor electrode is in the first connection state and connecting the auxiliary electrode to the detection circuit when the first change-over switch is in the second connection state; and a comparison/decision means operative to compare a first capacitance value from the detection circuit in the first connection state with a second capacitance value from the detection circuit in the second connection state to yield a comparison result, and decide whether or not a sense target locates within a range of a sense region based on the comparison result and the first or second connection state.

18. The capacitive proximity sensor according to claim 17, wherein the first change-over switch is configured such that in the second connection state it is capable of making the sensor electrode open, grounded, or connected to a certain fixed potential, wherein the second change-over switch is configured such that in the first connection state it is capable of making the auxiliary electrode open, grounded, or connected to a certain fixed potential.

19. The capacitive proximity sensor according to claim 17, further comprising a shield drive circuit for applying to the auxiliary electrode an equivalent potential as that on the sensor electrode or applying to the sensor electrode an equivalent potential as that on the auxiliary electrode, wherein the first change-over switch is configured such that in the second connection state it is capable of connecting the sensor electrode to the shield drive circuit, wherein the second change-over switch is configured such that in the first connection state it is capable of connecting the auxiliary electrode to the shield drive circuit.

20. The capacitive proximity sensor according to claim 17, further comprising a shield drive circuit for applying to the auxiliary electrode an equivalent potential as that on the sensor electrode, wherein the first change-over switch is configured such that in the second connection state it is capable of making the auxiliary electrode open, grounded, or connected to a certain fixed potential, wherein the second change-over switch is configured such that in the first connection state it is capable of connecting the auxiliary electrode to the shield drive circuit.

21. The capacitive proximity sensor according to claim 17, further comprising a shield drive circuit for applying to the sensor electrode an equivalent potential as that on the auxiliary electrode, wherein the first change-over switch is configured such that in the second connection state it is capable of connecting the auxiliary electrode to the shield drive circuit, wherein the second change-over switch is configured such that in the first connection state it is capable of making the auxiliary electrode open, grounded, or connected to a certain fixed potential.

22. The capacitive proximity sensor according to claim 21, wherein the shield electrode is connected to a shield drive circuit for applying an equivalent potential as that on at least either of the sensor electrode and the auxiliary electrode to the shield electrode.

23. A proximity sensing method in a capacitive proximity sensor, the sensor comprising a sensor electrode, an auxiliary electrode disposed coplanar with the sensor electrode in the vicinity of the sensor electrode, a detection circuit operative to detect a capacitance value based on a capacitance detected with at least either of the sensor electrode and the auxiliary electrode, and a change-over switch for switching between the connection states of the electrodes with the detection circuit, thereby deciding whether or not a sense target locates within a range of a sense region, the method comprising:

detecting capacitance value by the detection circuit as a first capacitance value;

switching between the connection states of the sensor and auxiliary electrodes with the detection circuit by the change-over switch to vary the equicapacitance lines or planes on the sense surface;

after the switching, detecting capacitance value by the detection circuit as a second capacitance value by using the equicapacitance lines or planes varied by the change-over switch switching the connection states of the sensor and auxiliary electrodes with the detection circuit; and deciding whether or not a sense target locates within the range of the sense region based on a comparison value between the first and second capacitance values and the first or second capacitance value.

24. The proximity sensing method according to claim 23, further comprising deciding the distance from the sense target to the sensor electrode based on the first or second capacitance value when the sense target locates within the range of the sense region.

* * * * *